(12) United States Patent
Matsuda et al.

(10) Patent No.: US 8,820,950 B2
(45) Date of Patent: Sep. 2, 2014

(54) LIGHT EMITTING DEVICE AND ILLUMINATION APPARATUS

(75) Inventors: Shuhei Matsuda, Yokosuka (JP); Soichi Shibusawa, Yokosuka (JP); Nobuhiko Betsuda, Yokosuka (JP); Kiyoshi Nishimura, Yokosuka (JP)

(73) Assignee: Toshiba Lighting & Technology Corporation, Kanagawa-ken (JP)

( * ) Notice: Subject to any disclaimer, the term of this patent is extended or adjusted under 35 U.S.C. 154(b) by 227 days.

(21) Appl. No.: 13/045,787

(22) Filed: Mar. 11, 2011

(65) Prior Publication Data
US 2011/0222264 A1 Sep. 15, 2011

(30) Foreign Application Priority Data

Mar. 12, 2010 (JP) .................. 2010-055564
Mar. 12, 2010 (JP) .................. 2010-055565
Mar. 16, 2010 (JP) .................. 2010-058581
Feb. 28, 2011 (JP) .................. 2011-042828

(51) Int. Cl.
*F21V 9/16* (2006.01)

(52) U.S. Cl.
USPC .................. 362/84; 362/231; 362/249.02

(58) Field of Classification Search
USPC .................. 362/617, 231, 249.01, 249.02
See application file for complete search history.

(56) References Cited

U.S. PATENT DOCUMENTS

| | | | |
|---|---|---|---|
| 4,600,977 A | 7/1986 | Barlian | |
| 5,836,676 A | 11/1998 | Ando et al. | |
| 6,234,648 B1 | 5/2001 | Borner | |
| 6,479,930 B1 | 11/2002 | Tanabe | |
| 7,581,853 B2 | 9/2009 | Kim | |
| 7,615,921 B2 | 11/2009 | Kimura | |
| 7,740,373 B2 | 6/2010 | Yoon et al. | |
| 7,791,092 B2 | 9/2010 | Tarsa et al. | |
| 7,821,188 B2 * | 10/2010 | Kurihara et al. | 313/484 |
| 7,855,449 B2 | 12/2010 | DeGraff et al. | |
| 7,942,550 B2 | 5/2011 | Inoue et al. | |

(Continued)

FOREIGN PATENT DOCUMENTS

| | | |
|---|---|---|
| CN | 1094657 | 11/2002 |
| CN | 1934721 | 3/2007 |

(Continued)

OTHER PUBLICATIONS

English Language Abstract of CN 101099245 published Jan. 2, 2008.

(Continued)

*Primary Examiner* — John A Ward
(74) *Attorney, Agent, or Firm* — DLA Piper LLP (US)

(57) ABSTRACT

According to one embodiment, a light emitting device which is attached to an illumination apparatus and radiates light having a correlated color temperature of 2900 to 3600K is provided. The light emitting device includes a substrate, blue light emitting LED elements and red light emitting LED elements mounted on the substrate, and a wavelength converting unit. The red light emitting LED elements have a luminous intensity of 0.2 to 2.5 times as large as that of the blue light emitting LED elements at normal use temperature in a state where the light emitting device is attached to the illumination apparatus. The wavelength converting unit is excited by light emitted from the blue light emitting LED elements and converts the light to light having a peak wavelength within a range of 500 to 600 nm.

11 Claims, 20 Drawing Sheets

(56) References Cited

U.S. PATENT DOCUMENTS

| | | | |
|---|---|---|---|
| 8,299,722 B2 * | 10/2012 | Melanson | 315/291 |
| 8,358,089 B2 * | 1/2013 | Hsia et al. | 315/334 |
| 8,519,714 B2 * | 8/2013 | Harbers | 324/414 |
| 8,596,819 B2 | 12/2013 | Negley | |
| 8,628,214 B2 | 1/2014 | Negley | |
| 2002/0070681 A1 | 6/2002 | Shimizu | |
| 2004/0239243 A1 * | 12/2004 | Roberts et al. | 313/512 |
| 2005/0116619 A1 | 6/2005 | Kuma et al. | |
| 2005/0248929 A1 | 11/2005 | Kawamura | |
| 2006/0124920 A1 | 6/2006 | Kimura | |
| 2006/0192483 A1 | 8/2006 | Nakanishi | |
| 2007/0023734 A1 | 2/2007 | Igarashi | |
| 2007/0023769 A1 | 2/2007 | Nishimoto | |
| 2007/0123135 A1 | 5/2007 | Yang et al. | |
| 2007/0159043 A1 | 7/2007 | Kubota | |
| 2007/0279903 A1 | 12/2007 | Negley | |
| 2008/0043473 A1 | 2/2008 | Matsui | |
| 2008/0094835 A1 | 4/2008 | Marra | |
| 2008/0129653 A1 | 6/2008 | Yamazaki | |
| 2008/0137008 A1 | 6/2008 | Rogojevic | |
| 2008/0191620 A1 | 8/2008 | Moriyama et al. | |
| 2008/0231162 A1 * | 9/2008 | Kurihara et al. | 313/487 |
| 2009/0045722 A1 | 2/2009 | Bai | |
| 2009/0050907 A1 | 2/2009 | Yuan | |
| 2009/0058278 A1 | 3/2009 | Ushikubo | |
| 2009/0184616 A1 | 7/2009 | Su | |
| 2009/0189516 A1 | 7/2009 | Kurata | |
| 2009/0212696 A1 | 8/2009 | Terao | |
| 2009/0230853 A1 | 9/2009 | Kanai | |
| 2009/0310335 A1 | 12/2009 | Park | |
| 2010/0039023 A1 | 2/2010 | Rogojevic | |
| 2010/0046232 A1 | 2/2010 | Matsui | |
| 2010/0237766 A1 | 9/2010 | Baumgartner | |
| 2011/0012143 A1 | 1/2011 | Yuan | |
| 2011/0279015 A1 * | 11/2011 | Negley et al. | 313/501 |
| 2012/0057339 A1 * | 3/2012 | Mitsuishi et al. | 362/231 |
| 2012/0241781 A1 | 9/2012 | Yuan | |
| 2013/0265753 A1 | 10/2013 | Negley | |

FOREIGN PATENT DOCUMENTS

| | | |
|---|---|---|
| CN | 1945099 | 4/2007 |
| CN | 1992364 | 7/2007 |
| CN | 101084585 | 12/2007 |
| CN | 101099245 | 1/2008 |
| CN | 101099254 | 1/2008 |
| CN | 201003739 | 1/2008 |
| DE | 10 2007 043355 | 3/2009 |
| DE | 10 2007 058703 | 3/2009 |
| EP | 1160883 | 12/2001 |
| EP | 1 850 399 | 10/2007 |
| JP | 3-119573 | 12/1991 |
| JP | H05-152609 | 6/1993 |
| JP | 2001-068742 | 3/2001 |
| JP | 2002-057376 | 2/2002 |
| JP | 2003-45206 | 2/2003 |
| JP | 2003-068109 | 3/2003 |
| JP | 2003-068111 | 3/2003 |
| JP | 2003-529889 | 10/2003 |
| JP | 2004-055772 | 2/2004 |
| JP | 2004-080046 | 3/2004 |
| JP | 2004-103443 | 4/2004 |
| JP | 2004-193357 | 7/2004 |
| JP | 2005-101296 | 4/2005 |
| JP | 2006-261702 | 2/2006 |
| JP | 2007-027421 | 2/2007 |
| JP | 2007-036041 | 2/2007 |
| JP | 2007-80533 | 3/2007 |
| JP | 2007-201473 | 8/2007 |
| JP | 2007-273559 | 10/2007 |
| JP | 2008/084988 | 4/2008 |
| JP | 2008-108835 | 5/2008 |
| JP | 2008-147610 | 6/2008 |
| JP | 2008-218238 | 9/2008 |
| JP | 2008-227412 | 9/2008 |
| JP | 2008-288412 | 11/2008 |
| JP | 2009-060069 | 3/2009 |
| JP | 2009-065137 | 3/2009 |
| JP | 2009-99510 | 5/2009 |
| JP | 2009-231027 | 10/2009 |
| JP | 2009-539227 | 11/2009 |
| JP | 2009-302339 | 12/2009 |
| JP | 2010/080117 | 4/2010 |
| JP | 2010-92993 | 4/2010 |
| WO | WO 00/19546 | 4/2000 |
| WO | WO 2008/127064 | 10/2008 |
| WO | WO 2008/127593 | 10/2008 |
| WO | WO 2008/156020 | 12/2008 |
| WO | WO 2009/033642 | 3/2009 |
| WO | WO 2009/041171 | 4/2009 |
| WO | WO 2009/049019 | 4/2009 |
| WO | WO 2009/148483 | 12/2009 |

OTHER PUBLICATIONS

U.S. Appl. No. 12/641,841.
Japanese Office Action issued in JP 2010-055564 on Oct. 31, 2012.
English Language Translation of Japanese Office Action issued in JP 2010-055564 on Oct. 31, 2012.
English Language Abstract of JP 2008-108835 published May 8, 2008.
English Language translation of JP 2008-108835 published May 8, 2008.
Japanese Office Action issued in JP 2009-003802 on Nov. 20, 2012.
English Language Translation of Japanese Office Action issued in JP 2009-003802 on Nov. 20, 2012.
English Language Abstract of JP 2001-068742 published Mar. 16, 2001.
English Language Translation of JP 2001-068742 published Mar. 16, 2001.
European Search Report issued in EP 09015879 on Nov. 26, 2012.
Chinese Office Action issued in CN 201110060028 on Dec. 28, 2012.
English Language Translation of Chinese Office Action issued in CN 201110060028 on Dec. 28, 2012.
English Language Abstract of CN 101099254 published Jan. 2, 2008.
U.S. Appl. No. 12/581,911.
U.S. Appl. No. 12/634,710.
English Abstract of JP 2010-080117 published Apr. 8, 2010.
English Translation of JP 2010-080117 pub lished Apr. 8, 2010.
A. R. Robertson, "The CIE 1976 Color-Difference Formulae," Color Research and Application, vol. 2, No. 1, p. 7-11, Spring 1977.
English Language Abstract of JP 2003-045206 published Feb. 14, 2003.
English Language Translation of JP 2003-045206 published Feb. 14, 2003.
English Language Abstract of JP 2005-101296 published Apr. 14, 2005.
English Language Translation of JP 2005-101296 published Apr. 14, 2005.
English Language Abstract of JP 2006-261702 published Sep. 28, 2006.
English Language Translation of JP 2006-261702 published Sep. 28, 2006.
English Language Abstract of JP 2007-080533 published Mar. 29, 2007.
English Language Translation of JP 2007-080533 published Mar. 29, 2007.
English Language Abstract of JP 2008-288412 published Nov. 27, 2008.
English Language Translation of JP 2008-288412 published Nov. 27, 2008.
English Language Abstract of JP 2009-099510 published Jul. 7, 2009.
Engish Language Translation of JP 2009-099510 published Jul. 7, 2009.
English Language Abstract of JP 2010-092993 published Apr. 22, 2010.

(56) References Cited

OTHER PUBLICATIONS

English Language Translation of JP 2010-092993 published Apr. 22, 2010.
English language abstract of JP-2008-218238 published Sep. 18, 2001.
Machine English language translation of JP-2008-218238 published Sep. 18, 2001.
English language abstract of JP-2008-147610 published Jun. 26, 2008.
Machine English language translation of JP-2008-147610 published Jun. 26, 2008.
English language abstract of JP-H05-152609 published Jun. 18, 1993.
Machine English language translation of JP-H05-152609 published Jun. 18, 1993.
English language abstract of JP-2004-193357 Published Jul. 8, 2004.
Machine English language translation of JP-2004-193357 Published Jul. 8, 2004.
English language abstract of JP-2003-068111 published Mar. 7, 2003.
Machine English language translation of JP-2003-068111 published Mar. 7, 2003.
English language abstract of JP-3-119573 Published Dec. 10, 1991.
English Language Abstract of JP 2008-227412 Published on Sep. 25, 2008.
English Language Translation of JP 2008-227412 Published on Sep. 25, 2008.
English Language Abstract of JP 2002-057376 Published on Feb. 22, 2002.
English Language Translation of JP 2002-057376 Published on Feb. 22, 2002.
Office Action issued in CN 200910179891 mailed Jan. 19, 2011.
English Language Abstract of CN 1094657 published Nov. 20, 2002.
Chinese Office Action issued in CN 200910211992.1 on Dec. 31, 2010.
English Language Translation of Chinese Office Action issued in CN 200910211992.1 on Dec. 31, 2010.
English Language Abstract of CN 201003739 published on Jan. 9, 2008.
English Translation of CN 1945099 published Apr. 4, 2007.
Chinese Office Action issued in CN 200910261396.4 on Mar. 18, 2011.
English Translation of Chinese Office Action issued in CN 200910261396.4 on Mar. 18, 2011.
English Language Abstract of CN 101084585 published Dec. 5, 2007.
English Language Abstract of CN 1992364 published Jul. 4, 2007.
Extended Search Report issued in EP 11157862 dated May 2, 2013.
Japanese Office Action issued in JP 2010-05565 dated May 1, 2013.
English Language Translation of Japanese Office Action issued in JP 2010-05565 dated May 1, 2013.
English Language Abstract of JP 2007-01473 published Aug. 9, 2007.
English Language Translation of JP 2007-01473 published Aug. 9, 2007.
English Language Abstract of JP 2004-55772 published Feb. 19, 2002.
English Language Translation of JP 2004-55772 published Feb. 19, 2002.
English Language Abstract of JP 2007-027421 published Feb. 1, 2007.
English Language Translation of JP 2007-027421 published Feb. 1, 2007.
English Language Abstract of JP 2008-084988 published Apr. 10, 2008.
English Language Translation of JP 2008-084988 published Apr. 10, 2008.
English Language Abstract of JP 2003-068109 published Mar. 7, 2003.
English Language Translation of JP 2003-068109 published Mar. 7, 2003.
English Language Abstract of DE 10 2007 043355 published Mar. 19, 2009.
English Language Abstract of DE 10 2007 058703 published Mar. 5, 2009.
U.S. Appl. No. 13/256,649.
Japanese Office Action issued in JP 2011-042828 on Jun. 25, 2014.
English Language Translation of JP 2003-529889 published Oct. 7, 2003.
English Language Abstract and Translation of JP 2009-231027 published Oct. 8, 2009.
English Language Abstract and Translation of JP 2009-060069 published Mar. 29, 2009.
English Language Translation of JP 2009-539227 published Nov. 12, 2009.
English Language Abstract and Translation of JP 2009-302339 published Dec. 24, 2009.
English Language Abstract and Translation of JP 2004-103443 published Apr. 2, 2004.
English Language Abstract and Translation of JP 2004-080046 published Mar. 11, 2004.
Japanese Office Action issued in JP 2010-055564 on Mar. 12, 2014.
English Language Translation of Japanese Office Action issued in JP 2010-055564 on Mar. 12, 2014.
English Language Abstract and Translation of JP 2007-036041 published Feb. 28, 2007.
English Language Abstract and Translation of JP 2007-273559 published Oct. 18, 2007.
English Language Abstract and Translation of JP 2009-065137 published Mar. 26, 2009.

* cited by examiner

| COLOR TEMPERATURE | LUMINOUS INTENSITY | | |
|---|---|---|---|
| | BLUE | RED | RED/BLUE |
| 2874 | 23.22 | 25.32 | 1.09 |
| 3283 | 28.20 | 17.85 | 0.63 |

| COLOR TEMPERATURE | LUMINOUS INTENSITY (RED/BLUE) |
|---|---|
| 2500 | 1.50 |
| 3000 | 0.95 |
| 3500 | 0.39 |

| LOWER LIMIT (CALCULATED VALUE) | | UPPER LIMIT (CALCULATED VALUE) | |
|---|---|---|---|
| COLOR TEMPERATURE | RED/BLUE | COLOR TEMPERATURE | RED/BLUE |
| 2400 | 1.5 | 2400 | 1.7 |
| 3600 | 0.2 | 3600 | 0.4 |

LIGHT EMITTING DEVICE AND ILLUMINATION APPARATUS

INCORPORATION BY REFERENCE

The present invention claims priority under 35 U.S.C. §119 to Japanese Patent Application Nos. 2010-055564, 2010-055565, 2010-058581 and 2011-042828 filed on Mar. 12, 2010, Mar. 12, 2010, Mar. 16, 2010 and Feb. 28, 2011, respectively. The contents of these applications are incorporated herein by reference in their entirety.

FIELD

Embodiments described herein relate generally to a light emitting device using LED elements as a light source, and an illumination apparatus including the light emitting device.

BACKGROUND

An illumination apparatus has been recently proposed which includes a light emitting device using LED elements as a light source. In the light emitting device, many bare chips of LED elements are mounted on a substrate, and these LED chips are electrically connected to each other by bonding wires and sealed with a sealing body containing fluorescent matter. White light, daylight color light, bulb color light, etc., are obtained.

However, light generated by such a light emitting device is low in the red component, and it is difficult to obtain light having a high light color rendering property, for example, bulb color light.

In view of this difficulty, it is considered that the number of red components is increased by sealing blue light emitting LED elements with a sealing body containing yellow fluorescent matter and red fluorescent matter. However, the red fluorescent matter has low energy conversion efficiency and there is the possibility of causing light emitting efficiency of the light emitting device to lower.

Additionally, a light emitting device has been proposed which includes: blue light emitting LED elements; red light emitting LED elements; and fluorescent matter which is excited by the blue light emitting LED elements and emits light at a light emission spectrum of a wavelength band between blue light of the blue light emitting LED element and red light of the red light emitting LED element. In this light emitting device, because red light is directly emitted from the red light emitting LED elements using the red light emitting LED elements, light emitting efficiency is prevented from lowering.

However, characteristics of the red light emitting LED element are largely changed depending on temperature, for example, color of emitted light is largely changed by a temperature change.

It is an object of the present invention to provide a light emitting device which can improve light emitting efficiency and reduce influence of a temperature change on color of emitted light regarding a red light emitting LED element in consideration of temperature characteristics of the red light emitting LED element, and an illumination apparatus including the light emitting device.

DETAILED DESCRIPTION

A light emitting device of one embodiment is attached to an illumination apparatus and radiates light having a correlated color temperature of 2400 to 3600K. The light emitting device includes a substrate, blue light emitting LED elements and red light emitting LED elements mounted on the substrate and a wavelength converting unit. The red light emitting LED elements have a luminous intensity of 0.2 to 2.5 times as large as that of the blue light emitting LED elements at normal use temperature in a state where the light emitting device is attached to the illumination apparatus. The wavelength converting unit is excited by light emitted from the blue light emitting LED elements and converts the light to light having a peak wavelength within a range of 500 to 600 nm.

Thus, it can be expected that a light emitting device is provided which has an excellent color rendering property and can improve light emitting efficiency and reduce influence of a temperature change on color of emitted light regarding the red light emitting LED element.

Figure 9:
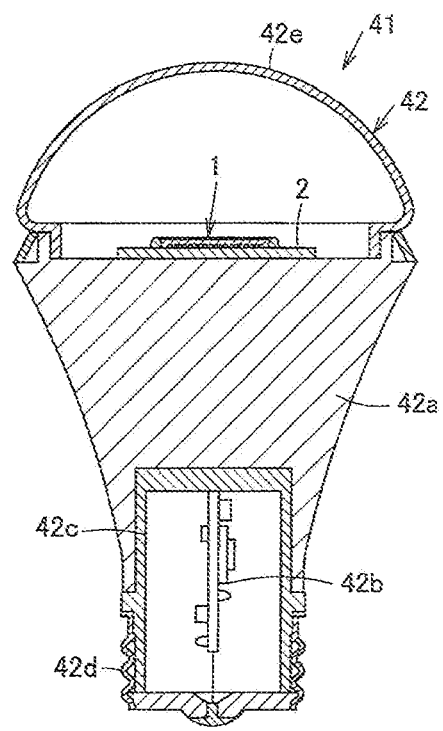
FIG. 9 is a cross sectional view of an LED lamp as an illumination apparatus including the light emitting device.
Figure 10:
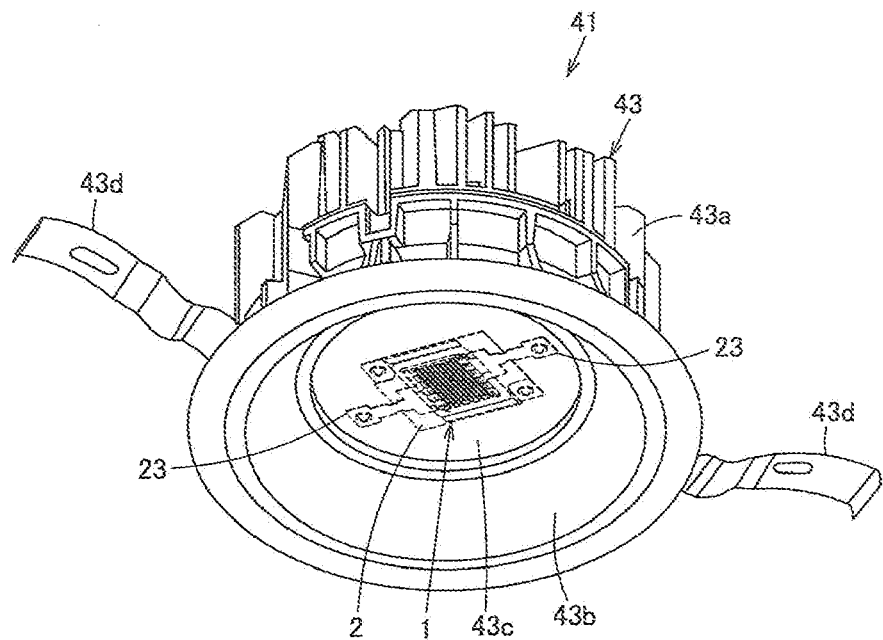
FIG. 10 is a perspective view of a downlight as the illumination apparatus including the light emitting device.

Next, a first embodiment will be described with reference to FIGS. 1 to 10. In addition, the same symbols are attached to the same parts as those in FIGS. 1 to 10, and description thereof will be omitted. FIGS. 1 to 4 show a light emitting device 1, FIGS. 5 to 8 indicate measurement results of color temperature, and FIGS. 9 and 10 show an illumination apparatus 41 including the light emitting device 1.

Figure 1:
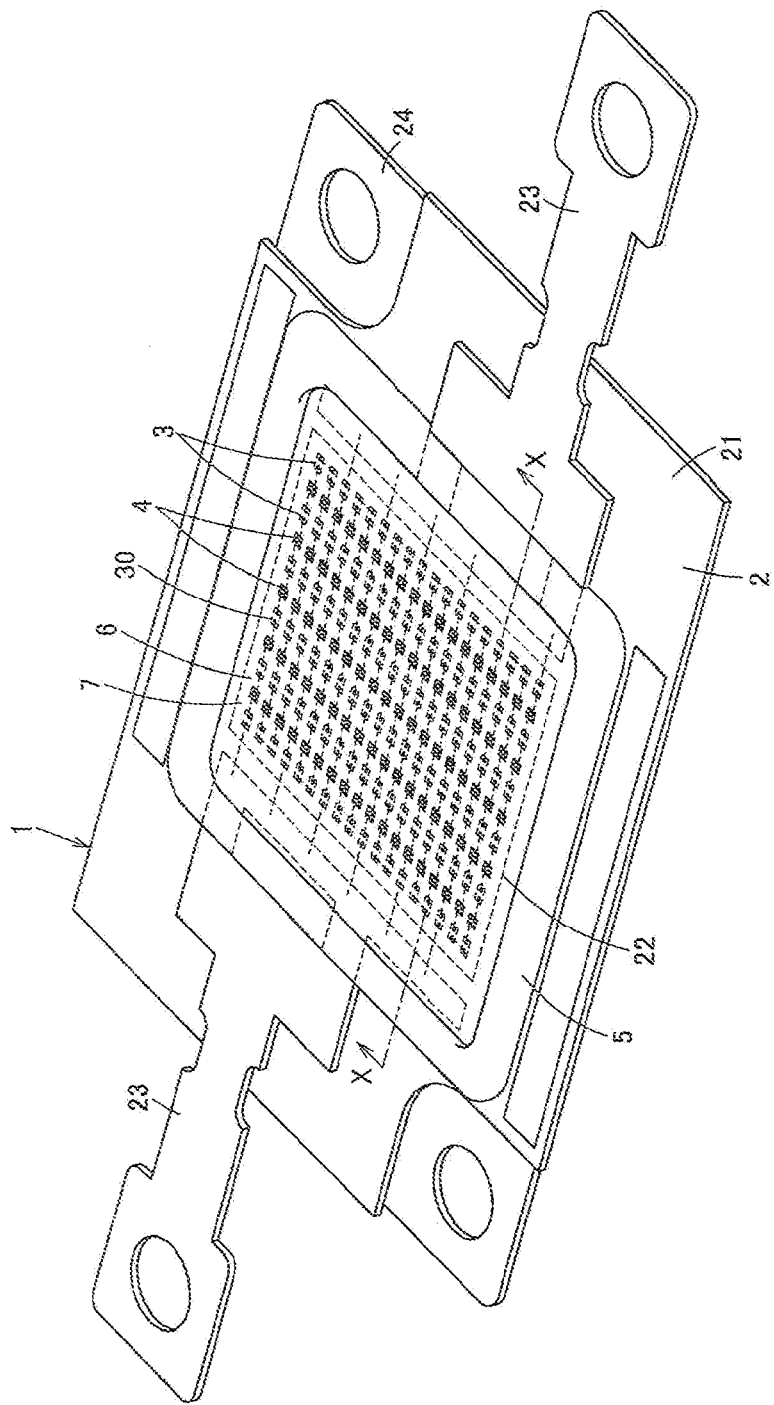
FIG. 1 is a perspective view of a light emitting device of a first embodiment.
Figure 2:
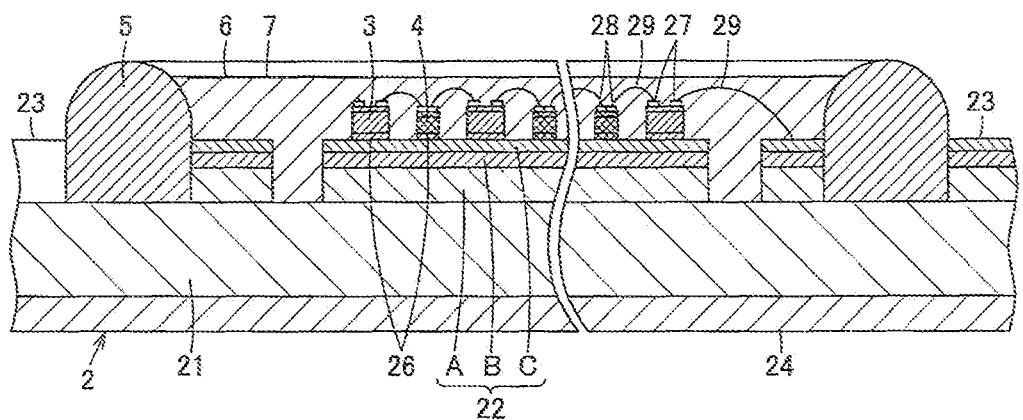
FIG. 2 is a cross sectional view taken along the X-X line in FIG. 1.

As shown in FIGS. 1 and 2, the light emitting device 1 includes: a substrate 2; a plurality of blue light emitting LED elements (hereinafter, referred to as blue light LEDs) 3 and red light emitting LED elements (hereinafter, referred to as red light LEDs) 4 mounted on the substrate 2; a frame member 5; and a sealing member 7 as a wavelength converting unit 6. That is, a COB (Chip On Board) method for mounting the plurality of LEDs 3 and 4 on the substrate 2 is adopted for the light emitting device 1.

Figure 3:
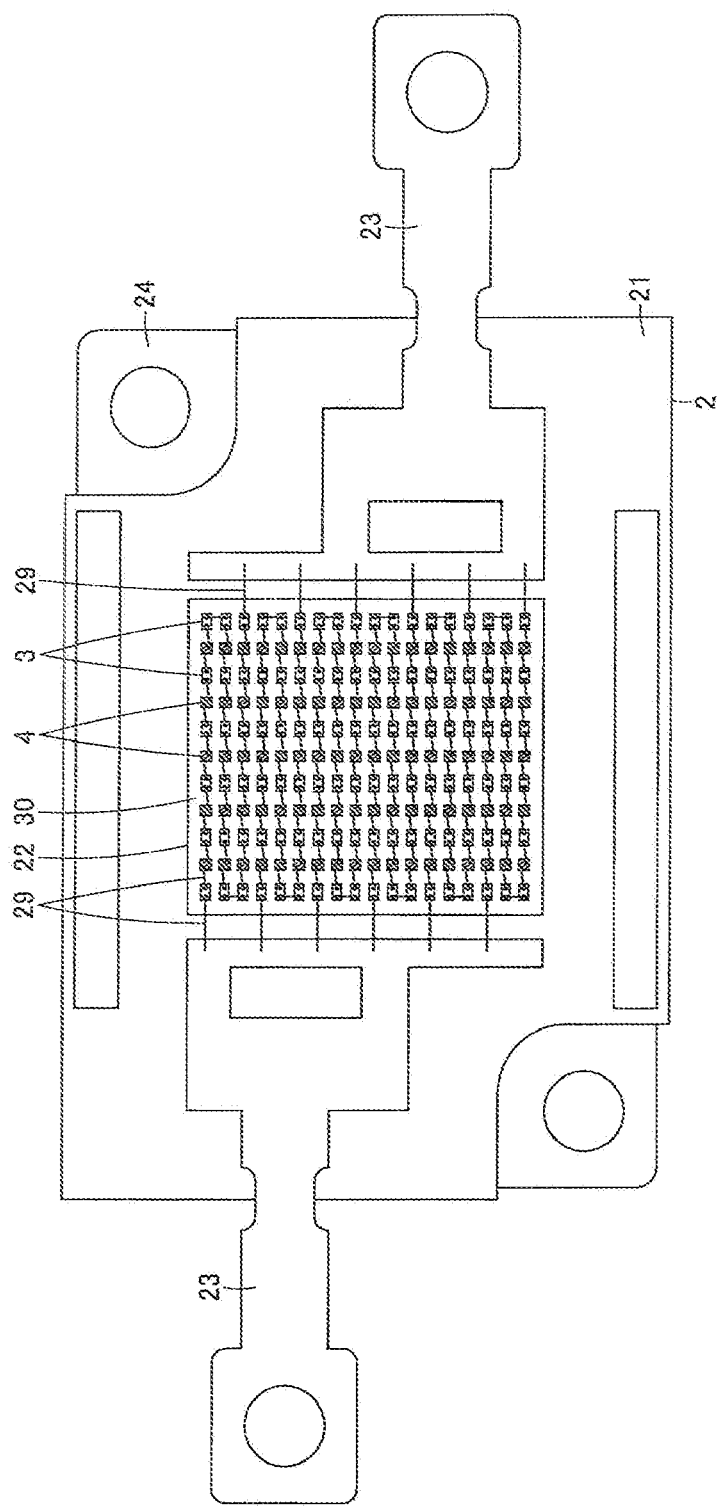
FIG. 3 is a plan view showing a state where, in the light emitting device, blue light emitting LED elements and red light emitting LED elements are mounted before a frame member and a sealing member are formed.

As shown in FIGS. 1 to 3, the substrate 2 includes: a base material 21; a mounting pad 22 and power supply terminals 23 which are mounted on a surface side of the base material 21; and a metallic plate member 24 provided on a backside of the base material 21. The mounting pad 22, the power supply terminals 23 and the metallic plate member 24 are respectively made of, for example, a copper plate material, and are directly joined to base material 21.

The base material 21 is formed, in an approximately four-sided shape, of a flat plate made of, for example, aluminum oxide, aluminum nitride or ceramics such as silicone nitride. As representatively shown in FIG. 3, the four-sided mounting pad 22, on which the blue LEDs 3 and the red LEDs 4 are mounted, is disposed on the center of the surface side of the base material 21. Additionally, the pair of power supply terminals 23 is disposed aside of both sides of the mounting pad 22 on the surface side of the base material 21 so as to be located away from each other at a predetermined interval.

On the other hand, the flat metallic plate member 24 is joined to approximately the whole face of the backside of the base material 21. The metallic plate member 24 has functions of radiating heat and preventing deformation of the substrate 2.

Moreover, a metallic substrate, in which an insulating layer is laminated on one face of a base plate made of metal such as aluminum having excellent thermal conductivity and heat radiation performance, can be adopted as the base material 21. When the base plate is made of insulation material, synthetic resin material such as glass epoxy resin is applicable.

As shown in FIG. 2, the mounting pad 22 and the power supply terminal 23 are respectively constituted by three layers, a first layer A constituted by a copper plate joined to the surface of the base material 21, a second layer B constituted in a manner of plating a surface of the copper plate with nickel (Ni) and a third layer C constituted in manner of plating a surface of the nickel layer with silver (Ag). The third layer C, a surface layer, of the mounting pad 22 is a silver (Ag)-plated layer and has a high total light beam reflectance of 90%.

Additionally, the blue LEDs 3 and the red LEDs 4 are mounted on the mounting pad 22 with use of silicone resin-based insulative adhesive 26.

The blue LED 3 is constituted by an InGaN type, GaN type or the like LED chip for emitting blue light having a wavelength of 450 to 470 nm. In the blue LED 3, a light-emitting layer for emitting blue light is laminated on an element substrate made of light-transmissive sapphire or the like and a pair of positive and negative element electrodes 27 for making current flow to the light-emitting layer is provided.

The red LED 4 is constituted by an AlGaInP type, GaAlAs liquid crystal type or the like LED chip for emitting red light having a wavelength of 580 to 620 nm. In the red LED 4, a light-emitting layer for emitting red light is laminated on an element substrate made of light-transmissive sapphire or the like and a pair of positive and negative element electrodes 28 for making current flow to the light-emitting layer is provided.

The element electrodes 27 and 28 are electrically connected to each other by a bonding wire 29. The bonding wire 29 is constituted by a thin gold (Au) wire and connected to the electrodes 27 and 28 via bumps each mainly containing gold (Au) for improving mounting intensity and reducing damage to the LED chip.

Figure 4:
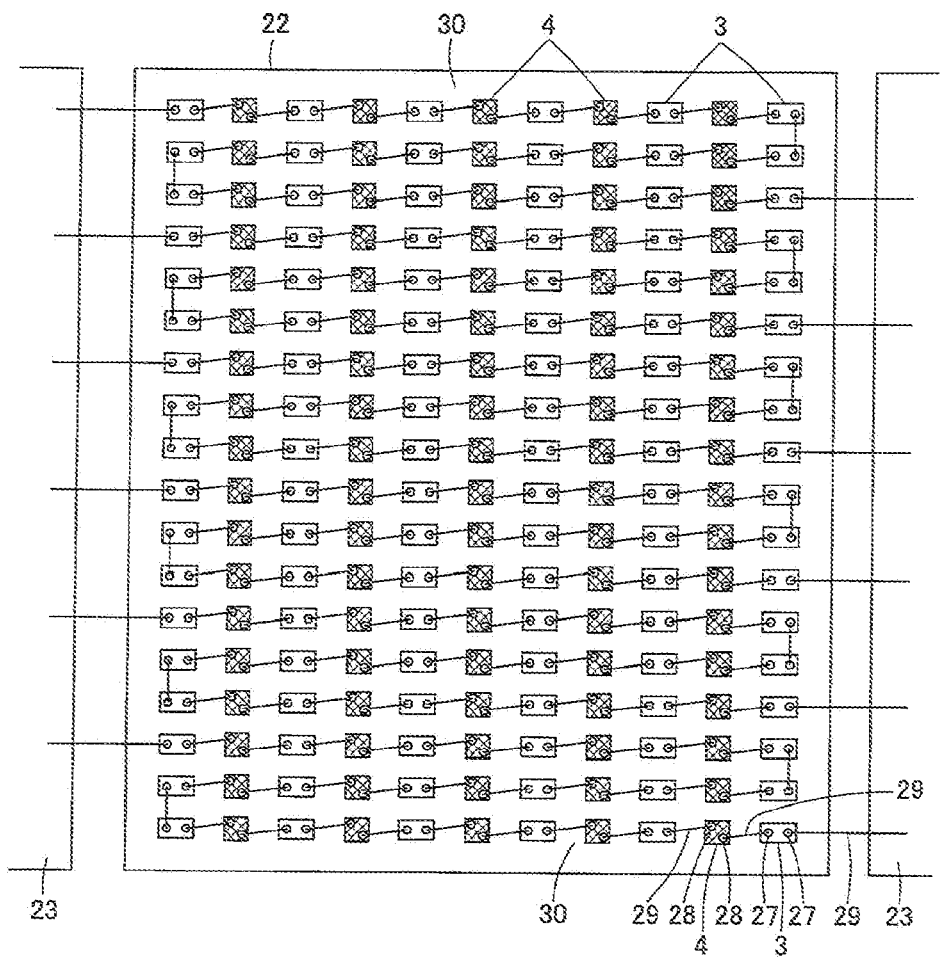
FIG. 4 is a plan view enlargedly showing the mounted blue light emitting LED elements and red light emitting LED elements.

As mainly shown in FIG. 4 (the red LED 4 is shown by mesh), the blue LEDs 3 and the red LEDs 4 are alternately mounted in a matrix shape on the mounting pad 22 and respectively form element rows of the plurality of blue LEDs 3 and red LEDs 4. Specifically, in the element row in a lateral direction in FIG. 4, the blue LEDs 3 and the red LEDs 4 are alternately arranged in an extending direction of the element row. Electrically, the blue LEDs 3 and the red LEDs 4 are connected in series every three of the plurality of element rows, six series circuits 30 are formed, and the series circuits 30 are connected to the pair of power supply terminals 23 so as to be in parallel to each other. Accordingly, power is supplied to the six series circuits 30 through the power supply terminals 23.

More specifically, focusing on the one series circuit 30, for example, in FIG. 4, the blue LEDs 3 and the red LEDs 4 are alternately arranged in an S-shape in a manner that a connection line connecting the LEDs is turned on end sides of the mounting pad 22. The number of blue LEDs 3 and red LEDs 4 are 18 and 15, respectively. The bonding wire 29 connected to the right side power supply terminal 23 is connected to the element electrode 27 at an anode side of the blue LED 3, the element electrode 27 at a cathode side thereof is connected to the element electrode 28 at an anode side of the adjacent red LED 4 by the bonding wire 29, and the element electrode 28 at a cathode side thereof is connected to the element electrode 27 at an anode side of the adjacent blue LED 3 by the bonding wire 29.

Such connection work is successively performed, different electrodes of the adjacent blue LED 3 and red LED 4 in the extending direction of the row, the element electrode 27 at the anode side of the adjacent blue LED 3 (or the element electrode 28 at the anode side of the adjacent red LED 4) and the element electrode 28 at the cathode side of the adjacent red LED 4 (or the element electrode 27 at the cathode side of the adjacent blue LED 3), are connected to each other by the bonding wire 29. The element electrode 27 at the cathode side of the blue LED 3 located at the rearmost position of the row is connected to the left side power supply terminal 23 by the bonding wire 29.

The total numbers of the blue LEDs 3 and red LEDs 4 used in the light emitting device 1 are 108 and 90 respectively, and the total number of the red LEDs 4 is approximately 0.8 times as large as that of the blue LEDs 3. Moreover, the mounting number and arrangement of the blue LEDs 3 and red LEDs 4 are not particularly limited.

As shown in FIGS. 1 and 2, the frame member 5 is adhered to the substrate 2 in a manner that, for example, uncured silicone resin having a predetermined viscosity is applied to the substrate 2 in a frame shape with use of a dispenser and then heated and cured. The frame member 5, applied in a four-sided shape, has an inner peripheral face having approximately a four-sided shape the same as that of the mounting pad 22. The whole of mounting pad 22 is disposed inside the frame member 5, that is, a mounting region of the blue LEDs 3 and red LEDs 4 is surrounded by the frame member 5.

The sealing member 7 as the wavelength converting unit 6 is made of light-transmissive synthetic resin, for example, transparent silicone resin, fills the inside of the frame member 5 and is provided on the substrate 2. The mounting pad 22, connection portions of the bonding wires 29 and the power supply terminals 23, the blue LEDs 3 and the red LEDs 4 are covered and sealed with the sealing member 7. A surface of the sealing member 7 serves as a light emitting face for radiating light outward.

The sealing member 7 contains a suitable amount of fluorescent matter. The fluorescent matter is excited by light emitted from the blue LEDs 3 and radiates light having a color different from that of the light emitted from the blue LEDs 3. In order to convert blue light emitted from the blue LEDs 3 to white light, yellow fluorescent matter is used as the fluorescent matter, the yellow fluorescent matter radiating yellow to green light has a complementary relationship to the blue light and has a peak wavelength within a range of 500 to 600 nm. The sealing member 7 is formed in a manner that a predetermined amount of uncured light-transmissive synthetic resin, with which the yellow fluorescent matter is mixed, is injected into the inside of the frame member 5, heated and cured. Thus, the sealing area of the sealing member 7 is determined by the frame member 5. Moreover, as the wavelength converting unit 6, a fluorescent filter may be used.

When power is supplied to the thus constituted light emitting device 1 through the power supply terminals 23, each blue LED 3 and red LED 4 emit light. A part of blue light emitted from the blue LED 3 excites the yellow fluorescent matter contained in the sealing member 7, is converted to yellow to green fluorescent light by the yellow fluorescent matter, penetrates the sealing member 7 and is radiated outward. The other part, which is emitted from the blue LED 3 and does not excite the yellow fluorescent matter, of the blue light directly penetrates the sealing member 7 and is radiated outward. Red light emitted from the red LED 4 does not excite the yellow fluorescent matter, penetrates the sealing member 7 and is radiated outward.

During light emission of each blue LED 3 and red LED 4, the mounting pad 22 functions as a heat spreader for diffusing heat generated from the blue LED 3 and the red LED 4. Light, which is emitted from the blue LEDs 3 and the red LEDs 4 and advances to the substrate 2, is reflected on the surface layer of the mounting pad 22 mainly in a light use direction.

Accordingly, blue light from the blue LEDs 3, yellow to green light from the yellow fluorescent matter and red light from the red LEDs 4 are mixed, and bulb color light having a correlated color temperature of 2400 to 3600K and an excellent color rendering property is emitted from the light emitting device 1.

Here, since the red light is directly radiated from the red LEDs 4, red components can be efficiently mixed and the color rendering property becomes excellent. However, characteristics of the red LED 4 are largely changed by a temperature change as described above, thereby causing a large change in the color of light emitted therefrom. Accordingly, it is required to, while the color rendering property is improved by increasing the luminous intensity of the red LEDs 4, for example, increasing the number thereof, limitedly use the red LEDs 4 so that influence of a temperature change on characteristics regarding the red LED 4 is reduced.

In the present embodiment, improvement in the color rendering property by the red LEDs 4 and reduction of the influence of a temperature change on characteristics regarding the red LED 4 are balancedly performed, and a luminous intensity ratio between the blue LEDs 3 and the red LEDs 4 is considered and calculated since the COB method is adopted for the light emitting device 1 and the light emitting face is large.

The present inventors performed experiments and observations on the color rendering property, and a change in color of emitted light by a temperature regarding the red LED 4.

With respect to the measurement condition in the experiment, an integrating sphere was used, the luminous intensities of the blue LEDs 3 and the red LEDs 4 of the light emitting device 1 and the color temperature before sealing by the sealing member 7 were measured with the integrating sphere, and a plurality of measurement values of the luminous intensities of the blue LEDs 3 and the red LEDs 4 and the color temperatures were obtained by changing power to be supplied to the blue LEDs 3 and the red LEDs 4. The temperatures of the blue LED 3 and the red LED 4 are set within a range of normal use temperature in a state where the light emitting device 1 is attached to the illumination apparatus 41, that is, within a range that the respective junction temperatures of the blue LED 3 and the red LED 4 are 120° C. or lower. Moreover, a lower limit of the respective junction temperatures of the blue LED 3 and the red LED 4 is the atmospheric temperature of the light emitting device 1.

Figures 5, 6, 7, 8:
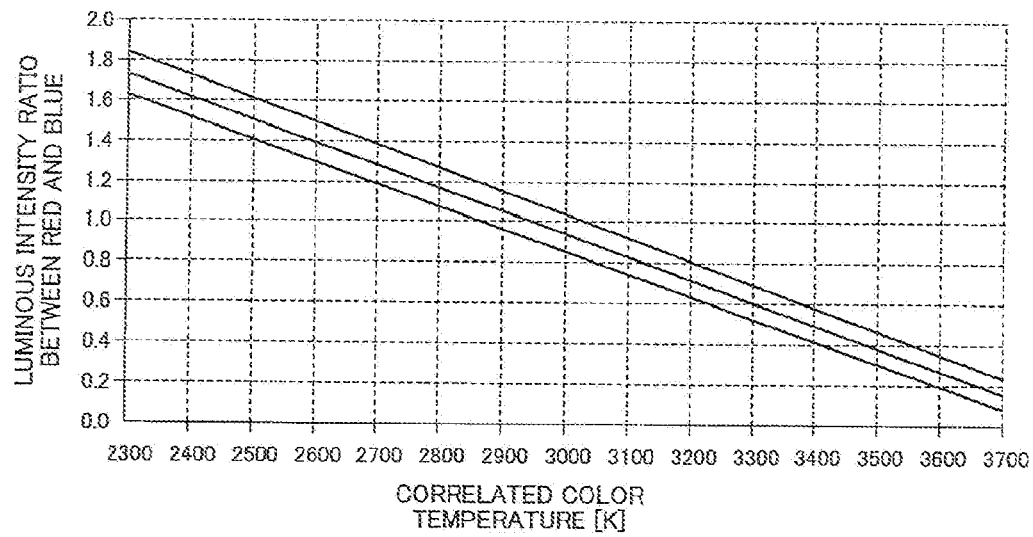
FIG. 5 is a table indicating measurement results of a correlated color temperature of the light emitting device, luminous intensities of the blue light emitting LED elements and the red light emitting LED elements, and a luminous intensity ratio between the blue light emitting LED elements and the red light emitting LED elements.
FIG. 6 is a table indicating measurement results of a correlated color temperature of the light emitting device and a luminous intensity ratio between the blue light emitting LED elements and the red light emitting LED elements.
FIG. 7 is a graph indicating, based on the measurement results, calculated values obtained by calculating a lower limit value and an upper limit value of a luminous intensity ratio of the red light emitting LED elements to the blue light emitting LED elements at correlated color temperatures of 2400K and 3600K.
FIG. 8 is a table indicating a relationship between the correlated color temperature and the luminous intensity ratio of the red light emitting LED elements to the blue light emitting LED elements.

Some of the measurement results are shown in FIG. 5. The luminous intensities of the blue LEDs 3 and the red LEDs 4 when the color temperatures were 2874K and 3283K were measured, and calculated luminous intensity ratios of the red LEDs 4 to the blue LEDs 3 are shown. The luminous intensities of the blue LEDs 3 and the red LEDs 4 when the color temperatures were 2500K, 3000K and 3500K were similarly measured, and calculated luminous intensity ratios of the red LEDs 4 to the blue LEDs 3 are shown in FIG. 6.

FIG. 7 indicates a graph created based on the measurement results shown in FIGS. 5 and 6. The lateral axis of the graph in FIG. 7 represents a correlated color temperature, the vertical axis thereof represents the luminous intensity ratio of the red LEDs 4 to the blue LEDs 3, the middle line of the three lines in the graph in FIG. 7 is a line connecting the plurality of actual measurement values indicated by the table in FIG. 5. The two upper and lower lines in relation to the middle line in the graph in FIG. 7 indicate a range of a permissible value that is calculated in accordance with a wavelength range indicating whether light, which is converted by the yellow fluorescent matter contained in the sealing member 7, has a short wavelength or long wavelength.

FIG. 8 indicates values obtained by calculating, based on the measurement results, a lower limit value and an upper limit value of the luminous intensity ratio of the red LEDs 4 to the blue LEDs 3 at correlated color temperatures of 2400K and 3600K.

From the measurement results, it was understood that it is desirable to set the luminous intensity of the red LEDs 4 to 0.2 to 1.7 times, as large as that of the blue LEDs 3 for obtaining bulb color light having a correlated color temperature of 2400 to 3600K and an excellent color rendering property within the range of the normal use temperature in the state where the light emitting device 1 is attached to the illumination apparatus 41, that is, within the range that the respective junction temperatures of the lit blue LED 3 and the lit red LED 4 are 120° C. or lower.

According to the observations, it was confirmed that the number of red components decreases and the color rendering property lowers when the luminous intensity of the red LEDs 4 is smaller than 0.2 times as large as that of the blue LEDs 3. Additionally, it was confirmed that, if the luminous intensity of the red LEDs 4 is smaller than 2.5 times as large as that of the blue LEDs 3 even when exceeding 1.7 times, light permitted as bulb color light can be obtained although the number of red components increases. Further, it was confirmed that, when the luminous intensity of the red LEDs 4 exceeds 2.5 times as large as that of the blue LEDs 3, the number of red components increases too much, light which is not the bulb color light is emitted and influence of a temperature change on color of emitted light regarding the red LED 4 becomes pronounced.

According to the present embodiment, an output reduction rate of the red LED 4 according to temperature rise is larger than that of the blue LED 3. When the temperatures of the blue LED 3 and the red LED 4 rise, the luminous intensity of the red LEDs 4 decreases, the number of red components decreases, and thus the luminous intensity ratio of the red LEDs 4 to the blue LEDs 3 tends to become small. On the other hand, when the temperatures of the blue LED 3 and the red LED 4 lower, the luminous intensity of the red LEDs 4 increases, the number of red components increases, and thus the luminous intensity ratio of the red LEDs 4 to the blue LEDs 3 tends to become large.

Accordingly, from the results of the experiments and observations, it was understood that it is desirable to set the luminous intensity of the red LEDs 4 to 0.2 to 2.5 times as luminous intensity of the blue LEDs 3, more desirable to set it to 0.2 to 1.7 times, in case the light emitting device 1 is used within the range of the normal temperature in the state where the light emitting device 1 using the red LEDs 4 and the blue LEDs Shaving such temperature characteristics is attached to the illumination apparatus 41, that is, within the range that the respective junction temperatures of the lit blue LED 3 and the lit red LED 4 are 120° C. or lower and a correlated color temperature is within 2400 to 3600K. That is, when the luminous intensity ratio of the red LEDs 4 to the blue LEDs 3 is within the range of 0.2 to 2.5 times, more preferably, 0.2 to 1.7 times, a change in color temperature by a temperature change is permitted.

In the present embodiment, the light emitting device is designed, in consideration of the characteristics, numbers, etc., of the blue LEDs 3 and red LEDs 4, so that the luminous intensity of the red LEDs 4 is 1.1 times as large as that of the blue LEDs 3 and the correlated color temperature is 2900K in the case where, for example, the respective junction temperatures of the blue LED 3 and the red LED 4 are approximately 90° C. when the blue LEDs 3 and the red LEDs 4 are lit. Thus, bulb color light can be emitted which has an excellent color rendering property and a correlated color temperature of 2400 to 3600K that a temperature change has little influence on characteristics regarding the red LED 4.

Moreover, it is preferable to use the fluorescent matter within a range of a quantum efficiency of 50 to 95%, and it is suitable to realize a color temperature of 2400 to 3600K by combining the fluorescent matter having a quantum efficiency in the above range with the blue LEDs 3 and the red LEDs 4 having a light intensity of 0.2 to 2.5 times as large as that of the blue LEDs 3.

Moreover, in the present embodiment, as understood from the above description, when, for example, a full light state is changed to a light control state, a current value in the light control state is lower than that in the full light state, and thus the junction temperature of each LED element in the light control state is lower than that in the full light state. Then, the number of red components increases and the color temperature becomes higher in the light control state compared with the full light state. Since the degree of change of the number of red components in the light control state tends to be similar to that of an incandescent bulb, the light emitting device 1 is extremely suitably used in place of the incandescent bulb.

As described above, according to the present embodiment, the light emitting device 1 can be provided which has an excellent color rendering property and can improve the light emitting efficiency and reduce influence of a temperature change on color of emitted light regarding the red LED 4, by setting the luminous intensity of the red LEDs 4 to 0.2 to 2.5 times, more preferably, 0.2 to 1.7 times, as large as that of the blue LEDs 3 within the range of the normal use temperature in the state where the light emitting device 1 is attached to the illumination apparatus 41, that is, within the range that the respective junction temperatures of the lit blue LED 3 and the lit red LED 4 are 120° C. or lower.

Since the blue LEDs 3 and the red LEDs 4 are alternately arranged, light emitted from the blue LEDs 3 and light emitted from the red LEDs 4 are excellently mixed and a desired light color can be obtained.

Since the blue LEDs 3 and the red LEDs 4 are integrally sealed with the sealing member 7, the temperature of the blue LED 3 can be made equivalent to that of the red LED 4, unevenness is reduced between the characteristics of the blue LED 3 and those of the red LED 4, light emitted from the blue LEDs 3 and light emitted from the red LEDs 4 are excellently mixed and a desired light color can be obtained. Additionally, since the blue LEDs 3 and the red LEDs 4 are integrally sealed with the sealing member 7, excellent productivity is obtained.

Further, since the series circuits 30 are provided each in which the blue LEDs 3 and the red LEDs 4 are alternately connected in series, it is not required to respectively conduct lighting control of the blue LEDs 3 and the red LEDs 4 by using different circuits, the lighting control of the blue LEDs 3 and the red LEDs 4 can be conducted by a single control system, and a control system can be simplified. For example, in the series circuit 30, a predetermined light color can be realized by selecting the numbers of the blue LEDs 3 and red LEDs 4 and mixing light emitted therefrom.

Next, an example that the light emitting device 1 is used for the illumination apparatus 41 will be described with reference to FIGS. 9 and 10.

A self-ballasted LED lamp 42 as the illumination apparatus 41 is shown in FIG. 9. The LED lamp 42 includes: the light emitting device 1; an apparatus body 42a thermally joined to the light emitting device 1; a lighting circuit 42b for conducting lighting control of the light emitting device 1; a cover member 42c in which the lighting circuit 42b is housed; a cap 42d attached to the cover member 42c; and a globe 42e which covers the light emitting device 1 and is attached to the apparatus body 42a.

The apparatus body 42a is made of, for example, metal such as aluminum excellent in thermal conductivity and formed in the shape of an approximate column the diameter of which is slowly elongated from one end side to the other end side, and a plurality of heat radiating fins are integrally formed on an outer circumferential face of the apparatus body 42a.

The lighting circuit 42b is constituted in a manner that circuit components are mounted on a flat four-sided lighting circuit substrate. The circuit components such as transistors, resistors, constant voltage diodes, a full-wave rectifier and capacitors are mounted on both faces of the lighting circuit substrate. The lighting circuit substrate is housed in the cover member 42c formed of insulative material such as PBT resin so that the lighting circuit substrate in its longitudinal direction is vertically arranged. Moreover, the light emitting device 1 and the lighting circuit 42b are electrically connected to each other by lead wires inserted in a wiring hole (not shown) provided in the apparatus body 42a.

According to the thus constituted LED lamp 42, power is supplied to the light emitting device 1 through the lighting circuit 42b, light penetrates the globe 42e and light having a desired color can be efficiently radiated.

FIG. 10 shows a downlight 43 as the illumination apparatus 41 which is embedded in a ceiling and used. The downlight 43 includes: the light emitting device 1; an apparatus body 43a in which the light emitting device 1 is housed; a light distributing member 43b attached to the apparatus body 43a; a light-transmissive cover 43c which covers the light emitting device 1 and disposed in the front of the downlight 43; and a power source unit (not shown) for supplying power to the light emitting device 1. Attachment plate springs 43d are attached to an outer circumferential side of the apparatus body 43a.

The apparatus body 43a is formed of excellent thermally-conductive material, for example, die casting made of aluminum alloy. A plurality of heat radiating fins extending vertically are formed on an outer face of the apparatus body 43a.

According to the thus constituted downlight 43, power is supplied to the light emitting device 1 through the power source unit, and thus light can be radiated which penetrates the cover 43c, is controlled by the light distributing member 43b and has a desired color.

Next, a second embodiment will be described with reference to FIG. 11. In addition, the same symbols are attached to the same or corresponding parts as those of the above-described embodiments, and description thereof will be omitted.

Figure 11:
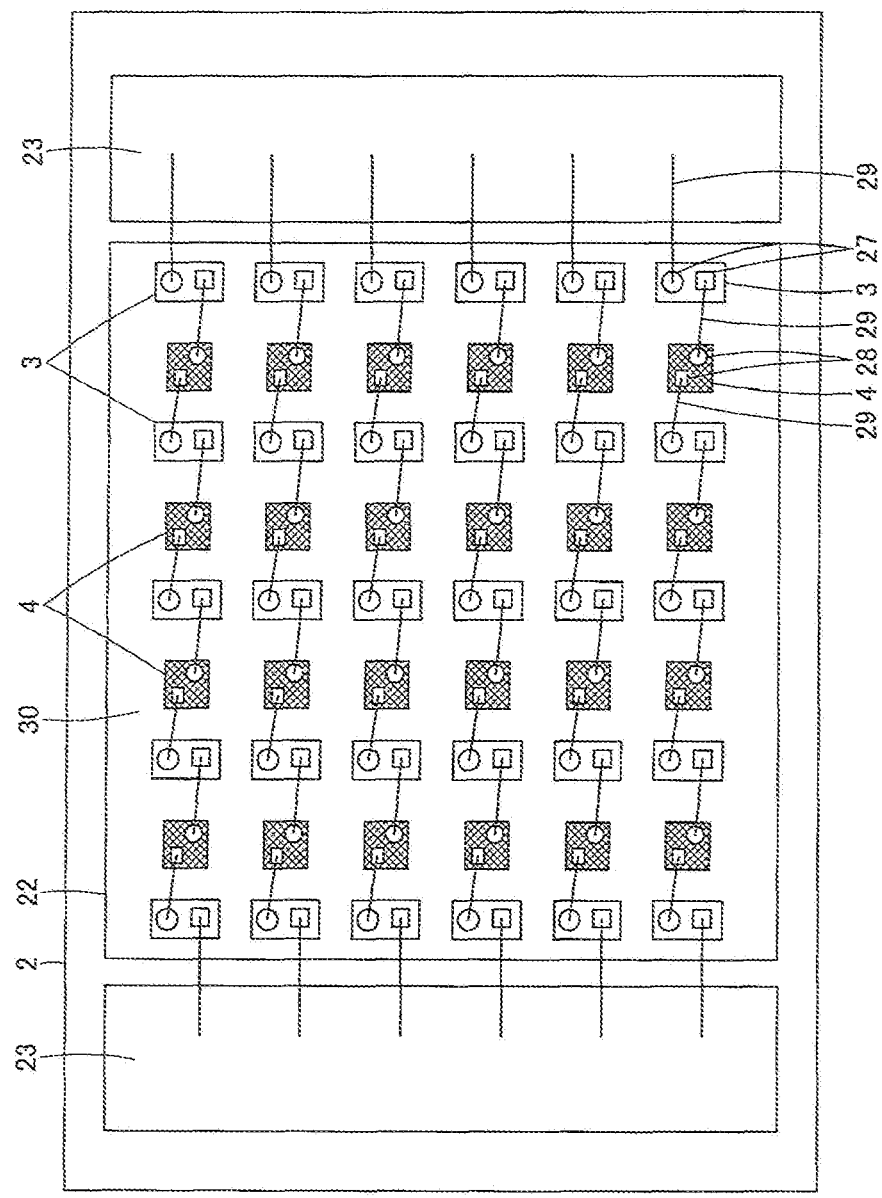
FIG. 11 shows a light emitting device of a second embodiment and is a plan view showing a state where blue light emitting LED elements and red light emitting LED elements are mounted before a frame member and a sealing member are formed.

In the present embodiment, each blue LED 3 is arranged so that the pair of element electrodes 27 of the blue LED 3 is orthogonal to the lateral direction of the element row extending direction in FIG. 11. Thus, the light emitting device can be downsized in the extending direction of the element row.

The blue LEDs 3 and the red LED 4 are alternately arranged on the mounting pad 22, and six series circuits are connected in parallel to each other.

The luminous intensity of the red LEDs 4 is set to 0.2 to 2.5 times, more preferably, 0.2 to 1.7 times, as large as that of the blue LEDs 3 within the range of the normal use temperature in the state where the light emitting device 1 is attached to the illumination apparatus 41, that is, within the range that the respective junction temperatures of the lit blue LED 3 and the lit red LED 4 are 120° C. or lower.

Therefore, according to the second embodiment, the same effect as that of the first embodiment can be obtained.

Next, a third embodiment will be described with reference to FIG. 12. In addition, the same symbols are attached to the same or corresponding parts as those of the above-described embodiments, and description thereof will be omitted.

In the present embodiment, the red LEDs 4 are arranged to the power supply terminals 23 sides on both sides. That is, the red LEDs 4 are mounted on both sides of the mounting pad 22.

The blue LEDs 3 and the red LEDs 4 are arranged on the mounting pad 22, and five series circuits 30 are connected in parallel to each other. In each series circuit 30, the bonding wire 29 connected to the right side (in FIG. 12) power supply terminal 23 is connected to the element electrode 28 of the anode side of the red LED 4, the element electrode 28 of the cathode side thereof is connected to the element electrode 28 of the anode side of the adjacent red LED 4 by the bonding wire 29, and then the element electrode 28 of the cathode side thereof is connected to the element electrode 27 of the anode side of the blue LED 3 by the bonding wire 29. Then, the element electrodes 27 of the blue LEDs 3 are successively connected to each other by the bonding wires 29, the leftmost blue LED 3 is connected to the adjacent red LED 4 by the bonding wire 29, the red LED 4 is connected to the adjacent leftmost red LED 4 by the bonding wire 29, and the leftmost red LED 4 is connected to the left side power supply terminal 23 by the bonding wire 29.

Similar to the above embodiments, the luminous intensity of the red LEDs 4 is set to 0.2 to 2.5 times, more preferably, 0.2 to 1.7 times, as large as that of the blue LEDs 3 within the range of the normal use temperature in the state where the light emitting device 1 is attached to the illumination apparatus 41, that is, within the range that the respective junction temperatures of the lit blue LED 3 and the lit red LED 4 are 120° C. or lower.

Therefore, according to the third embodiment, in addition to the effect of the first embodiment, influence of a temperature change on characteristics regarding the red LED 4 can be reduced. That is, when the plurality of blue LEDs 3 and red LEDs 4 are mounted on the substrate 2, the temperature of the center portion of the substrate 2 easily rises and a temperature change tends to become large. Then, by arranging the red LEDs 4 on end sides of the substrate 2, not arranging them on the center portion thereof, the degree of influence on a temperature change of the LED 4 can be reduced.

Figure 13:
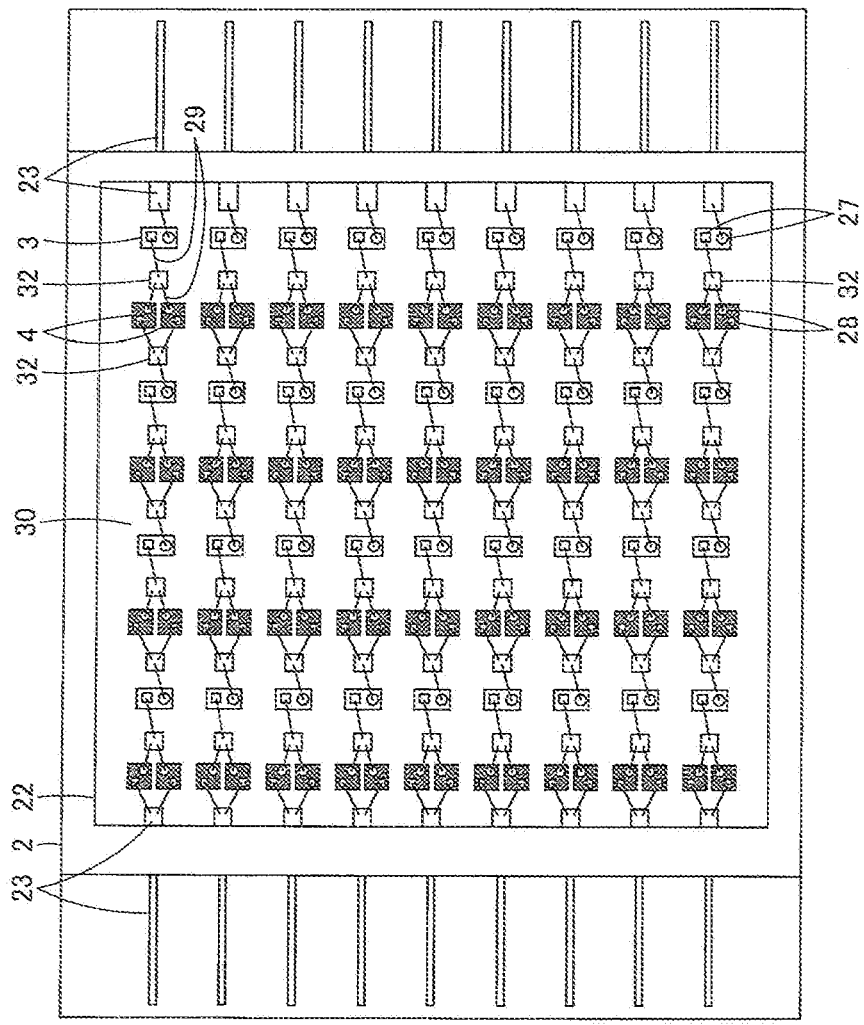
FIG. 13 shows a light emitting device of a fourth embodiment and is a plan view showing a state where blue light emitting LED elements and red light emitting LED elements are mounted.

Next, a fourth embodiment will be described with reference to FIG. 13. In addition, the same symbols are attached to the same or corresponding parts as those of the above-described embodiments, and description thereof will be omitted.

In the present embodiment, parallel circuits, each in which the two red LEDs 4 are connected in parallel, and the blue LEDs 3 are alternately arranged in series to constitute the series circuit 30. A four-sided connection conductor 32 is adhered by insulative adhesive between the two red LEDs 4 and the blue LED 3. Nine series circuits 30 are provided, and connected to the power source side so as to be in parallel to each other.

More specifically, in each series circuit 30, the bonding wire 29 connected to the right side (in FIG. 13) power supply terminal 23 is connected to the element electrode 27 of the anode side of the blue LED 3, the element electrode 27 of the cathode side thereof is connected to the connection conductor 32, the two bonding wires 29 connected to the connection conductor 32 are connected to the element electrode 28 of the anode sides of the adjacent two red LEDs 4, the two bonding wires 29 connected to the element electrodes 28 of the cathode sides thereof are connected to the adjacent connection conductor 32, and the connection conductor 32 and the element electrode 27 of the anode side of the adjacent blue LED 3 are connected by the bonding wire 29. The blue LEDs 3 and the red LEDs 4 are thus successively connected by the bonding wires 29.

Similar to the above embodiments, the luminous intensity of the red LEDs 4 is set to 0.2 to 2.5 times, more preferably, 0.2 to 1.7 times, as large as that of the blue LEDs 3 within the range of the normal use temperature in the state where the light emitting device 1 is attached to the illumination apparatus 41, that is, within the range that the respective junction temperatures of the lit blue LED 3 and the lit red LED 4 are 120° C. or lower.

Therefore, according to the fourth embodiment, in addition to the effect of the first embodiment, current flowing to the red LEDs 4 can be reduced by connecting the red LEDs 4 in parallel to each other. Therefore, lowering of efficiency of the red LED 4 in which the efficiency is greatly lowered due to increase in current can be suppressed.

Next, a fifth embodiment will be described with reference to FIG. 14. In addition, the same symbols are attached to the same or corresponding parts as those of the above-described embodiments, and description thereof will be omitted.

In the present embodiment, based on the first embodiment, in addition to the yellow fluorescent matter (first fluorescent matter) for radiating light having a peak wavelength within a range of 500 to 600 nm, fluorescent matter (second fluorescent matter) for converting light radiated from the blue LEDs 3 to light having a wavelength longer than that of the yellow fluorescent matter is contained in the sealing member 7.

Specifically, the blue LEDs 3 and the red LEDs 4 are mounted on the substrate 2 and sealed with the sealing member 7 containing two kinds of fluorescent matter, the first fluorescent matter and the second fluorescent matter. That is, the blue LEDs 3 and the red LEDs 4 are sealed with the sealing member 7 in which the yellow fluorescent matter, which is excited by blue light emitted from the blue LEDs 3 to emit yellow to green light, and the red fluorescent matter, which is similarly excited by blue light emitted from the blue LEDs 3 to emit red light, are mixed at a predetermined rate.

Figure 14:
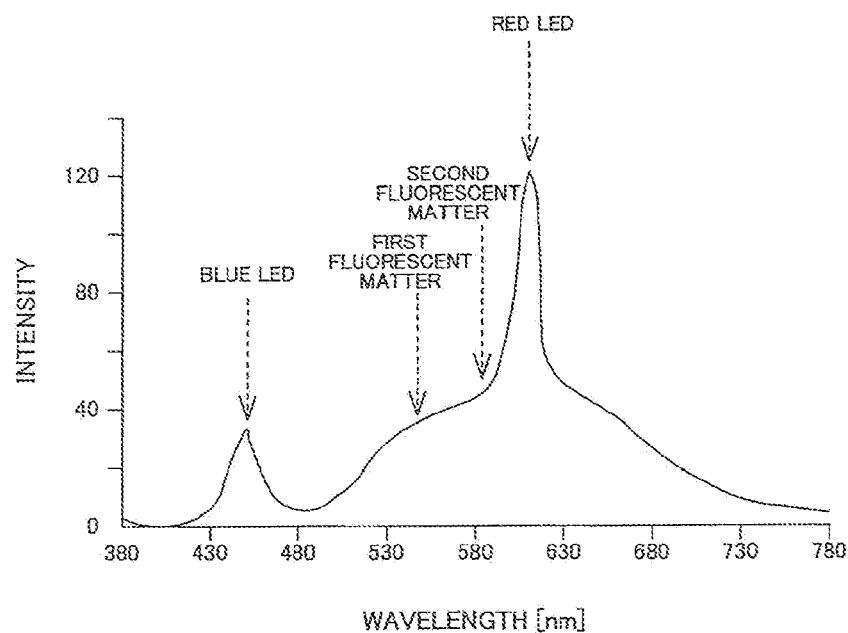
FIG. 14 is a graph indicating a light emission spectrum of a light emitting device of a fifth embodiment.

By such a constitution, the spectral spectrum shown in FIG. 14 is obtained. In FIG. 14, the horizontal axis represents a wavelength (nm) and the vertical axis represents relative intensity. As shown in FIG. 14, light having a longer wavelength is added by the second fluorescent matter so that the number of red components is increased.

Therefore, according to the fifth embodiment, light emitting efficiency can be improved by the blue LEDs 3 and the red LEDs 4, and, by increasing the number of red components with use of the red fluorescent matter, the luminous intensity of the red LEDs 4 is lowered and influence of a temperature change on characteristics regarding the red LED 4 can be reduced.

Figure 15:
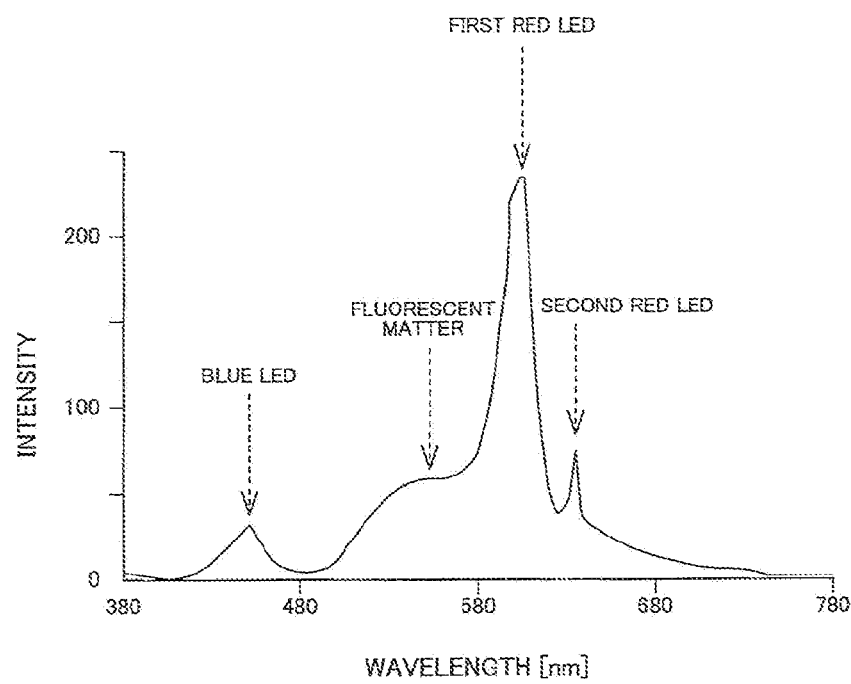
FIG. 15 is a graph indicating a light emission spectrum of a light emitting device of a sixth embodiment.

Next, a sixth embodiment will be described with reference to FIGS. 15 and 16. In addition, the same symbols are attached to the same or corresponding parts as those of the above-described embodiments, and description thereof will be omitted.

In the present embodiment, in addition to the blue LEDs 3 and the red LEDs 4 (first red LEDs 4a) of the third embodiment, second red LEDs 4b are mounted on the substrate 2. The second red LED 4b emits light having a wavelength of 625 to 645 nm longer than that of the first red LED 4a as shown in the light emission spectrum in FIG. 15. By such a constitution, the number of red components is increased and the color rendering property can be improved.

Figure 16:
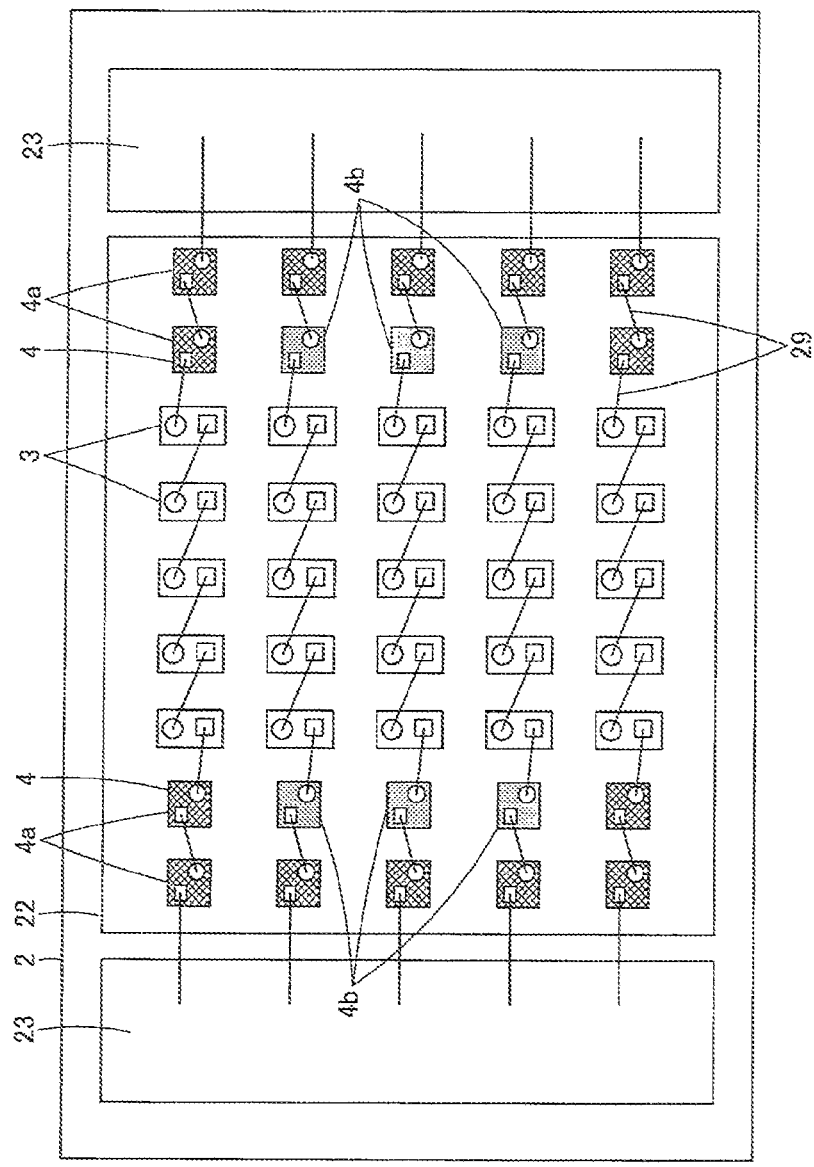
FIG. 16 shows the light emitting device of the sixth embodiment and is a plan view showing a state where blue light emitting LED elements and red light emitting LED elements are mounted before a frame member and a sealing member are formed.

As shown in FIG. 16, for example, the second red LEDs 4b may be arranged in the middle three element rows. Specifically, the second red LEDs 4b are arranged adjacently to the first red LEDs 4a located at both ends of each middle element row. In this case, it is preferable to set the luminous intensity of the second reds LED 4b having low light emitting efficiency lower than that of the first red LED 4a. For example, although 14 first red LEDs 4a are mounted, 6 second red LEDs 4b are mounted.

Next, a seventh embodiment will be described with reference to FIGS. 17 and 18. In addition, the same symbols are attached to the same or corresponding parts as those of the above-described embodiments, and description thereof will be omitted.

In the present embodiment, based on the first embodiment, in place of the sealing member 7, another sealing member 7 is provided which includes two kinds of sealing members, a first sealing member 7a and a second sealing member 7b.

Figure 17:
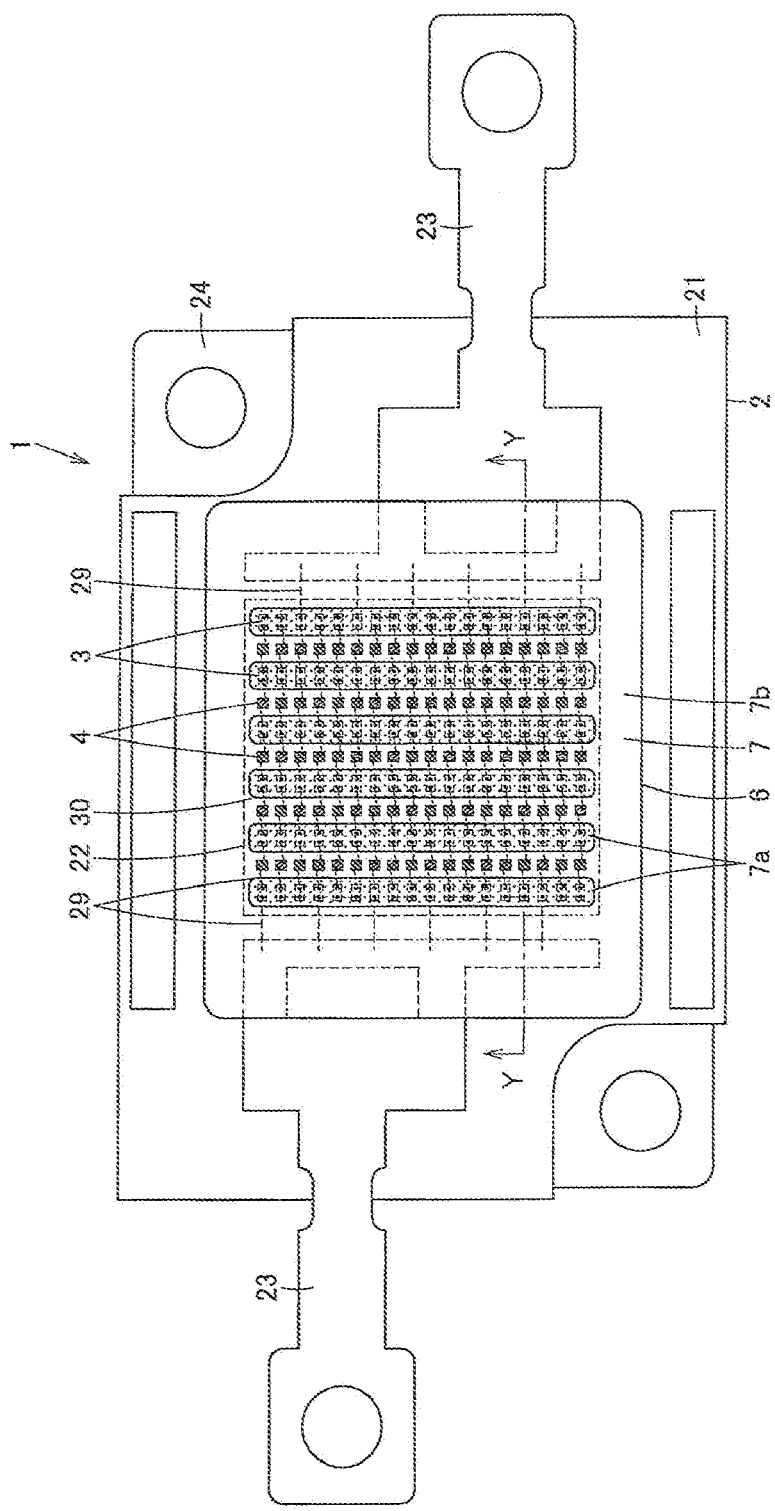
FIG. 17 is a cross sectional view of a light emitting device of a seventh embodiment.
Figure 18:
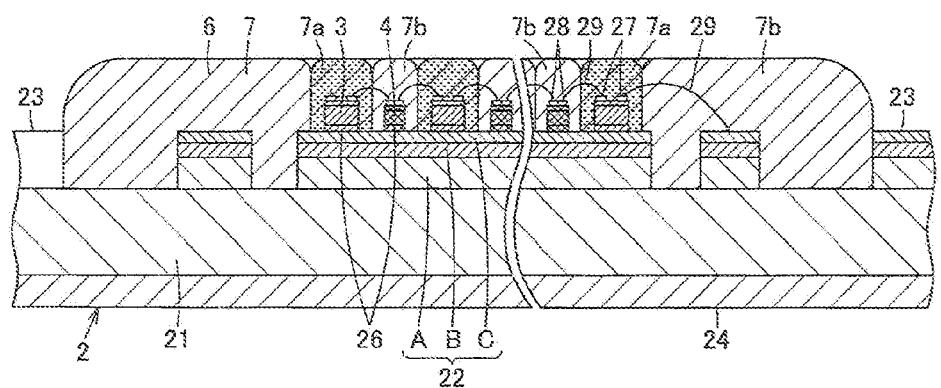
FIG. 18 is a cross sectional view taken along the Y-Y line in FIG. 17.

In FIG. 17, vertical element lines are formed in addition to the lateral element rows (element rows of the blue LEDs 3 and the red LEDs 4 electrically connected). The vertical lines of the blue LEDs 3 and the vertical lines of the red LEDs 4 are alternately arranged in the lateral direction, and a total of eleven vertical lines (six vertical lines of the blue LEDs 3 plus five vertical lines of the red LEDs 4) are formed.

A mounting region of the blue LEDs 3 and the red LEDs 4 is sealed with the sealing member 7. The sealing member 7 is made of light-transmissive synthetic resin, for example, transparent silicone resin, and includes the two kinds of sealing members, the first sealing member 7a containing fluorescent matter and the second sealing member 7b containing no fluorescent matter.

The first sealing member 7a is formed for the blue LEDs 3, the vertical lines of the blue LEDs 3, so that the plurality of blue LEDs 3 are integrally covered. Accordingly, the six vertical lines of the blue LEDs 3 are sealed with the first sealing member 7a.

The second sealing member 7b is formed for the red LEDs 4, the vertical lines of the red LEDs 4, so that the plurality of red LEDs 4 are integrally covered. Accordingly, the five vertical lines of the red LEDs 4 are covered with the second sealing member 7b. In addition, portions, to which the bonding wires 29 are connected, of the power supply terminals 23 are covered with the second sealing member 7b, and the sealing member 7b is formed, in a four-sided shape as a whole, on a region remaining after removing a region on which the blue LEDs 3 are mounted of the substrate 2. Thus, the first sealing member 7a is surrounded by the second sealing member 7b.

The fluorescent matter contained in the first sealing member 7a is excited by light emitted from the blue LEDs 3 and radiates light having color different from color of the light emitted from the blue LEDs 3. In order to convert blue light emitted from the blue LEDs 3 to white light, yellow fluorescent matter is used as the fluorescent matter, the yellow fluorescent matter radiating yellow to green light has a complementary relationship to blue light and has a peak wavelength within a range of 500 to 600 nm.

The sealing member 7 is applied to the substrate 2 in a state of being uncured. For example, the viscosity of the second sealing member 7b is adjusted so as to be relatively high. Accordingly, first, the second sealing member 7b is applied to the element lines of the red LEDs 4 except the region on which blue LED 3 is mounted. Then, the first sealing member 7a is applied or injected to the element lines of the blue LEDs 3 to which the second sealing member 7b is not applied. In this case, the second sealing member 7b functions as a frame member for preventing the first sealing member 7a from flowing out even if the viscosity of the first sealing member 7a is low. Then, the sealing members 7a and 7b are heated and cured so as to form into the sealing member 7.

Accordingly, although a frame member may be provided, it can be omitted and no frame member is particularly required to be provided. Moreover, the above forming method of the sealing member 7 is only cited as an example of a forming method thereof, and the forming method is not limited to the above forming method.

When power is supplied to the thus constituted light emitting device 1 through the power supply terminals 23, the blue LEDs 3 and the red LEDs 4 emit light. A part of blue light emitted from the blue LEDs 3 excites the yellow fluorescent matter contained in the first sealing member 7a, is converted to yellow to green light and radiated outward from the first sealing member 7a. The other part of the blue light radiated from the blue LEDs 3 which does not excite the yellow fluorescent matter directly penetrates the first sealing member 7a and is radiated outward. Red light emitted from the red LEDs 4 penetrates the second sealing member 7b and is radiated outward. In this case, since the second sealing member 7b contains no fluorescent matter, the red light emitted from the red LEDs 4 is radiated outward without receiving attenuation action from fluorescent matter.

Accordingly, the blue light from the blue LEDs 3, the yellow to green light from the yellow fluorescent matter, and the red light from the red LEDs 4 are mixed, and bulb color light having an excellent color rendering property is radiated from the light emitting device 1. In this case, since the red light is directly radiated from the red LEDs 4, light emitting efficiency is raised, red components are mixed and the color rendering property becomes excellent.

As described above, according to the present embodiment, the light emitting device 1 can be provided which does not lower light emitting efficiency and has an excellent color rendering property. Since the fluorescent matter contained in the sealing member 7 is used for the blue LEDs 3, the amount of fluorescent matter can be reduced and an advantage can be obtained in terms of cost. Additionally, since the first sealing member 7a and the second sealing member 7b can be disposed along the element lines of the blue light-emitting LEDs 3 and the element lines of the red light-emitting LEDs 4, forming processes of the sealing member 7 can be simplified. Further, since the first sealing member 7a is surrounded by the second sealing member 7b, the second sealing member 7b can function as a frame member for preventing the first sealing member 7a from flowing out and diffusing.

Figure 19:
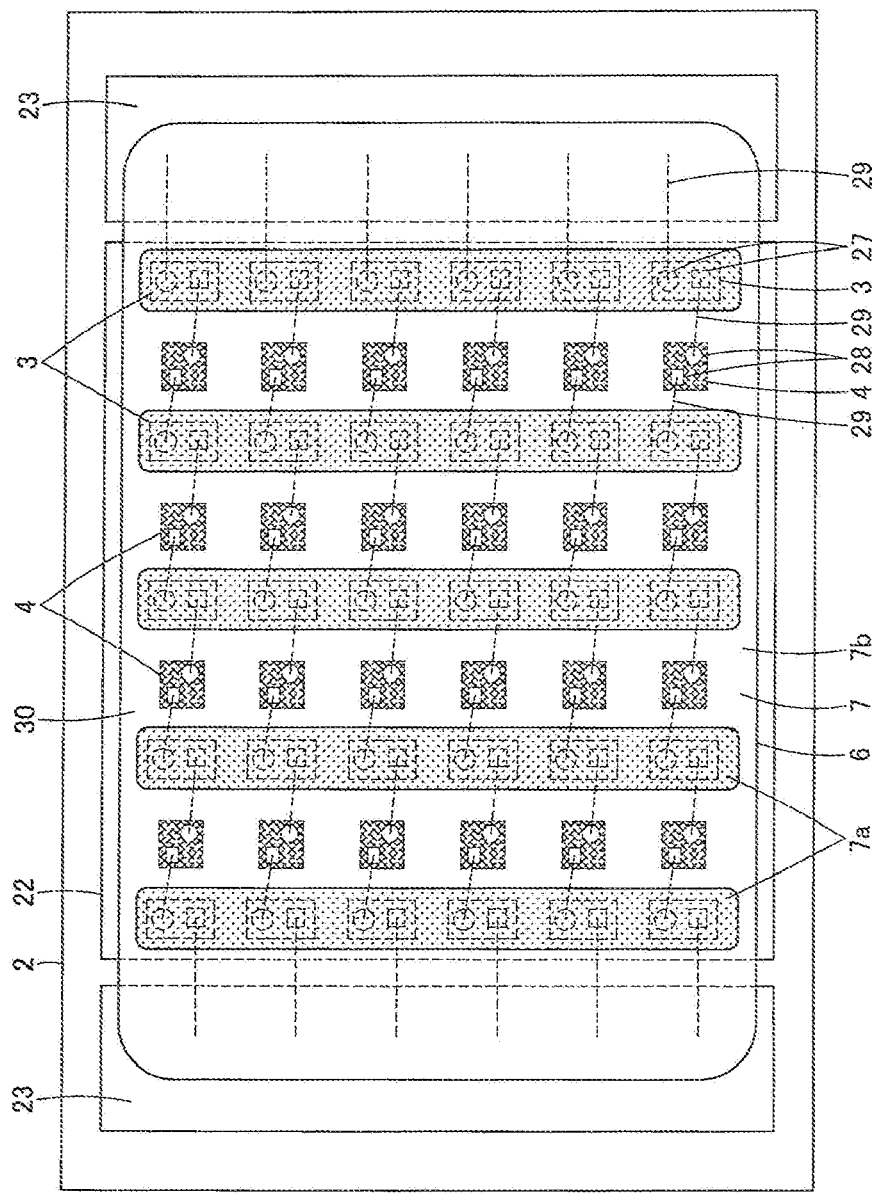
FIG. 19 is a plan view of a light emitting device of an eighth embodiment.

Next, an eighth embodiment will be described with reference to FIG. 19. In addition, the same symbols are attached to the same or corresponding parts as those of the above-described embodiments, and description thereof will be omitted.

In the present embodiment, based on the constitution of the second embodiment shown in FIG. 11, the sealing member 7 is provided which includes the two kinds of sealing members, the first sealing member 7a and the second sealing member 7b.

Regarding arrangement of each blue LED 3, the element electrodes 27 are aligned in an extending direction (vertical direction in FIG. 19) of an element line of the blue LEDs 3. The lines of the blue LEDs 3 and the lines of the red LEDs 4 are alternately arranged in lines, and five element lines of the blue LEDs 3 and four element lines of the red LEDs 4 are provided.

According to the present embodiment, in addition to the effects of the above embodiments, the first sealing member 7a can be downsized in its width dimension, and the amount of fluorescent matter can be further reduced.

Figure 20:
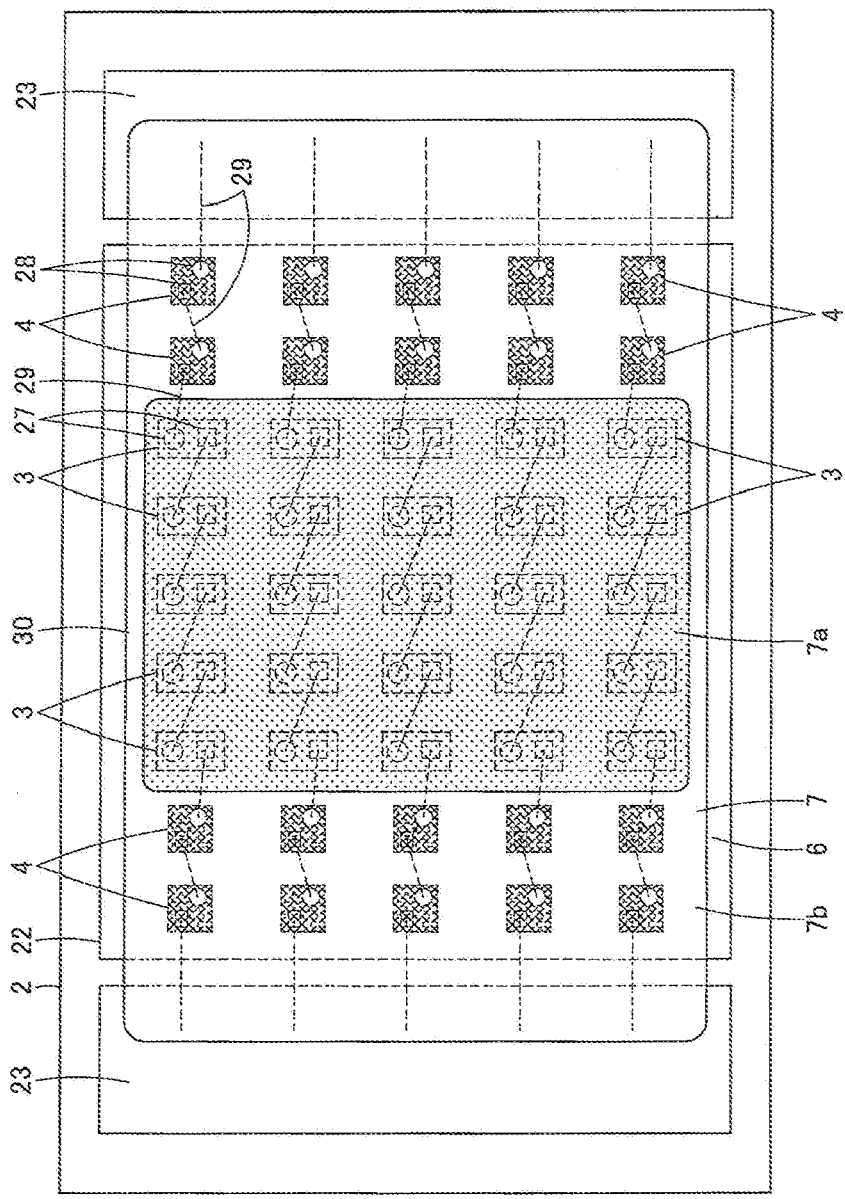
FIG. 20 is a plan view of a light emitting device of a ninth embodiment.

Next, a ninth embodiment will be described with reference to FIG. 20. In addition, the same symbols are attached to the same or corresponding parts as those of the above-described embodiments, and description thereof will be omitted.

Figure 12:
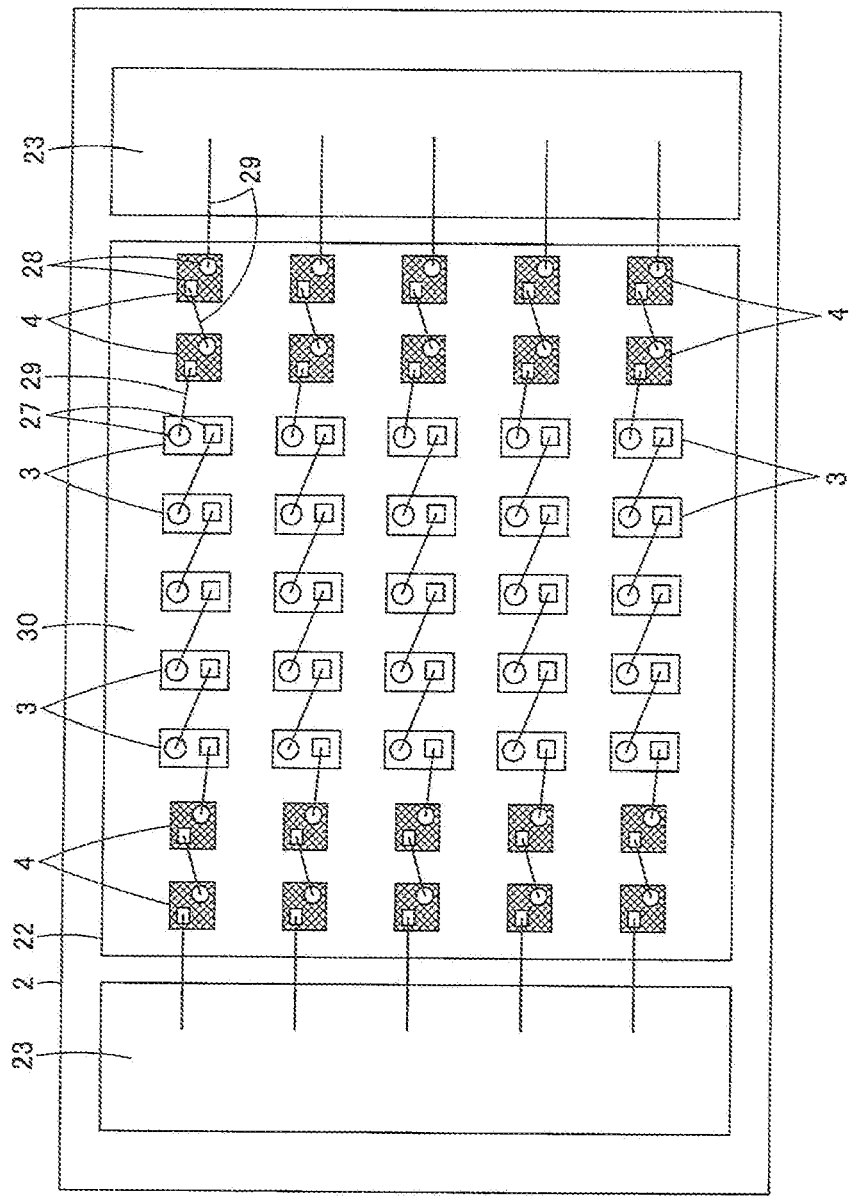
FIG. 12 shows a light emitting device of a third embodiment and is a plan view showing a state where blue light emitting LED elements and red light emitting LED elements are mounted.

In the present embodiment, based on the constitution of the third embodiment shown in FIG. 12, the sealing member 7 is provided which includes the two kinds of sealing members, the first sealing member 7a and the second sealing member 7b.

The red LEDs 4 are arranged to the power supply terminals 28 sides on both sides. That is, the red LEDs 4 are mounted on both sides of the mounting pad 22.

Lines of the blue LEDs 3 and lines of the red LEDs 4 are vertically (in FIG. 20) formed. The two element lines of the red LEDs 4 are arranged on both sides, and the five element lines of the blue LEDs 3 are arranged on the center portion.

The blue LEDs 3 concentratedly mounted on the center portion are covered with the first sealing member 7a. The first sealing member 7a is surrounded by the second sealing member 7b, and the element lines of the red LEDs 4 and portions, to which the bonding wires 29 are connected, of the power supply terminals 23 are covered with the sealing member 7b.

According to the present embodiment, in addition to the effects of the above embodiments, the number of forming regions of the sealing member 7 is reduced, that is, only two forming regions are provided, and thus forming processes of the sealing member 7 can be simplified. Although the characteristics of the red LED 4 are largely changed by a temperature change, influence of the temperature change on the characteristics can be reduced. When the blue LEDs 3 and the red LEDs 4 are mounted on the substrate 2, the center portion of the substrate 2 easily rises in temperature and a temperature change tends to become large. Accordingly, by arranging the red LEDs 4 on the end sides of the substrate 2, not arranging them on the center portion thereof, the degree of influence on a temperature change of the LED 4 can be reduced.

Figure 21:
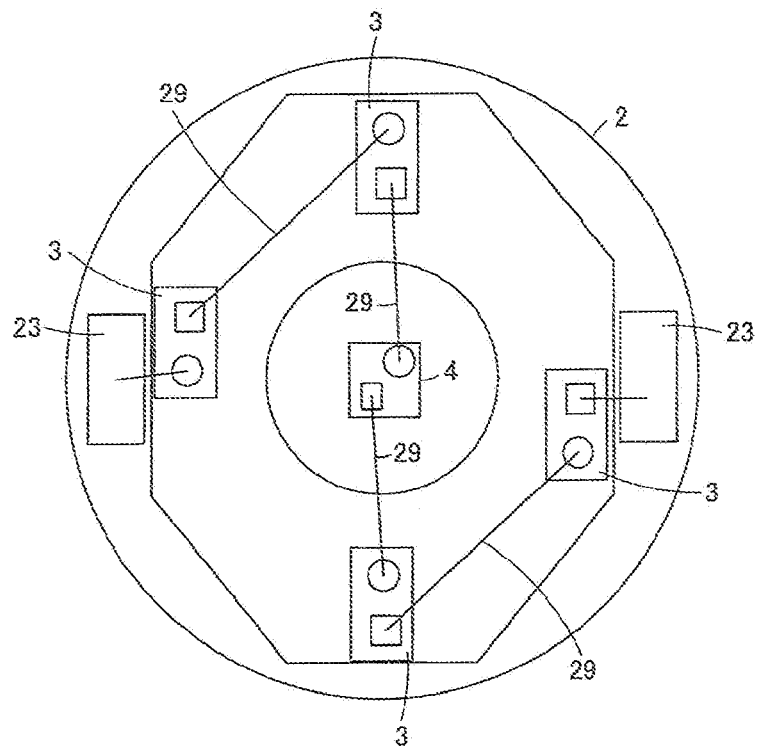
FIG. 21 shows a light emitting device of a tenth embodiment and is a plan view showing a state where blue light emitting LED elements and red light emitting LED elements are mounted before a sealing member is formed.
Figure 22:
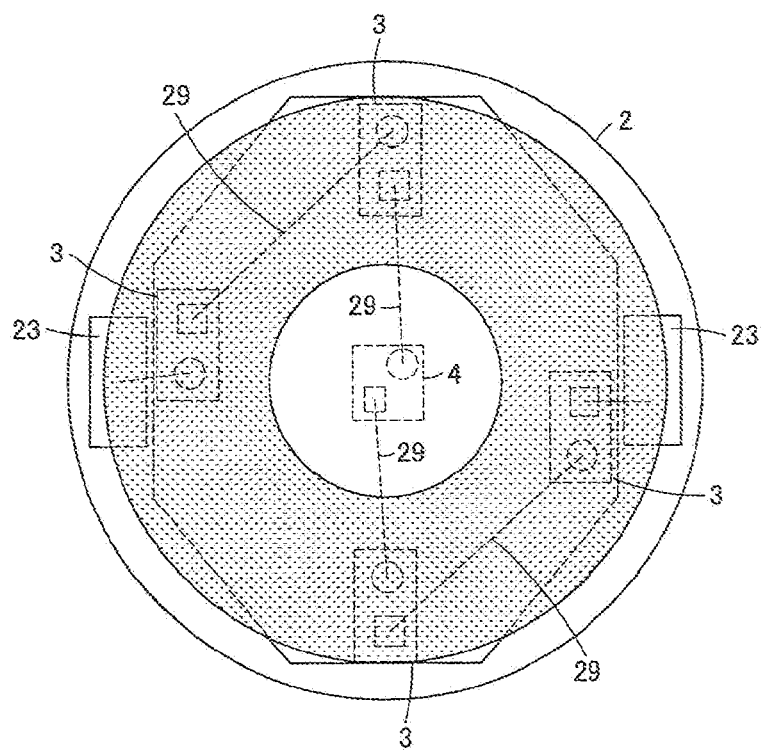
FIG. 22 is a plan view of the light emitting device of the tenth embodiment.

Next, a tenth embodiment will be described with reference to FIGS. 21 and 22. In addition, the same symbols are attached to the same or corresponding parts as those of the above-described embodiments, and description thereof will be omitted.

In the present embodiment, the substrate 2 is circularly formed, one red LED 4 is arranged on the center portion of an approximately eight-sided mounting pad 22 and four blue LEDs 3 are arranged so as to surround the red LED 4. The red LED 4 on the center portion is covered with the second sealing member 7b, and the blue LEDs 3 surrounding the red LED 4 are covered with the first sealing member 7a. Accordingly, the first sealing member 7a containing fluorescent matter is disposed so as to surround the second sealing member 7b.

Also according to the present embodiment, the same effects as those of the above embodiments can be obtained.

Moreover, it is allowed that one blue LED 3 is surrounded by four red LEDs 4 and the first sealing member 7a is surrounded by the second sealing member 7b.

Next, an eleventh embodiment will be described with reference to FIGS. 23 and 27. In addition, the same symbols are attached to the same or corresponding parts as those of the above-described embodiments, and description thereof will be omitted.

Figure 23:
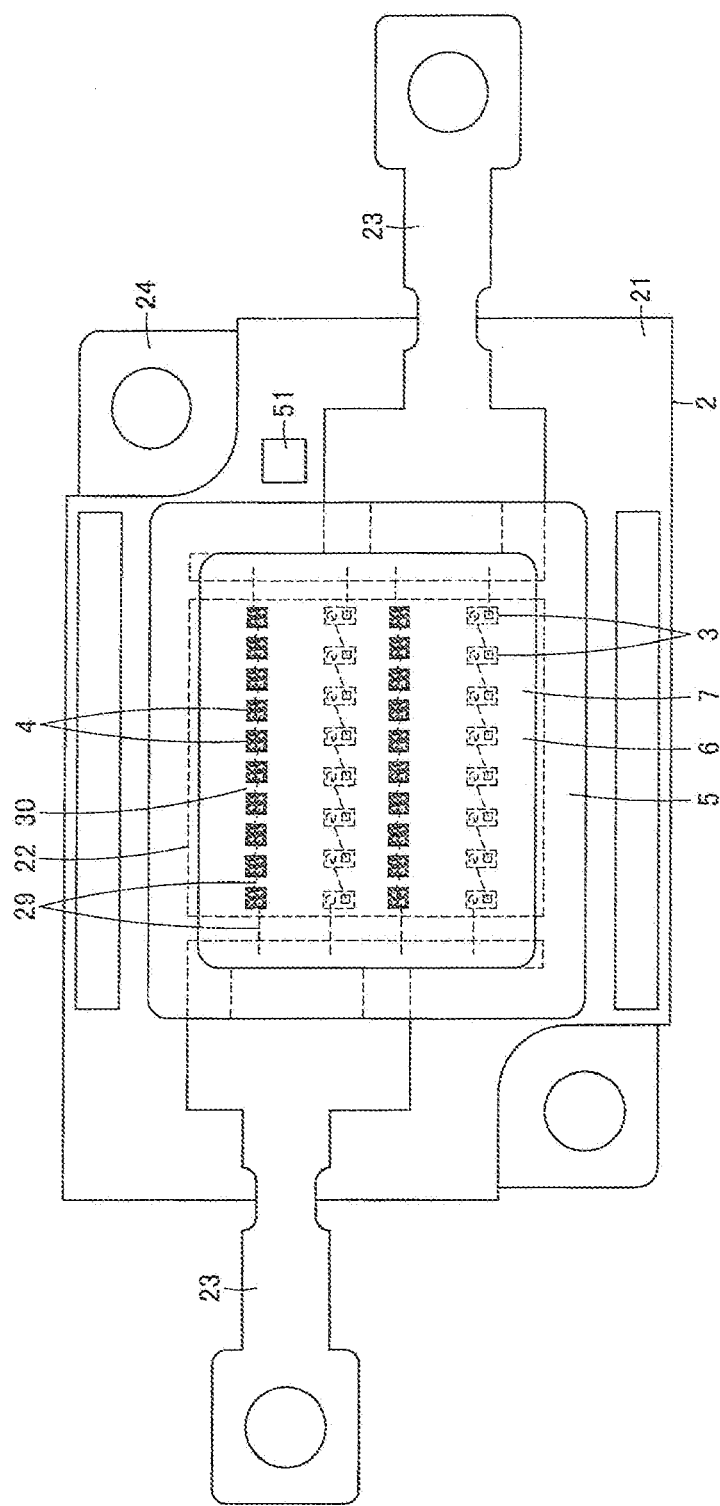
FIG. 23 is a perspective view of a light emitting device of an eleventh embodiment.
Figure 24:
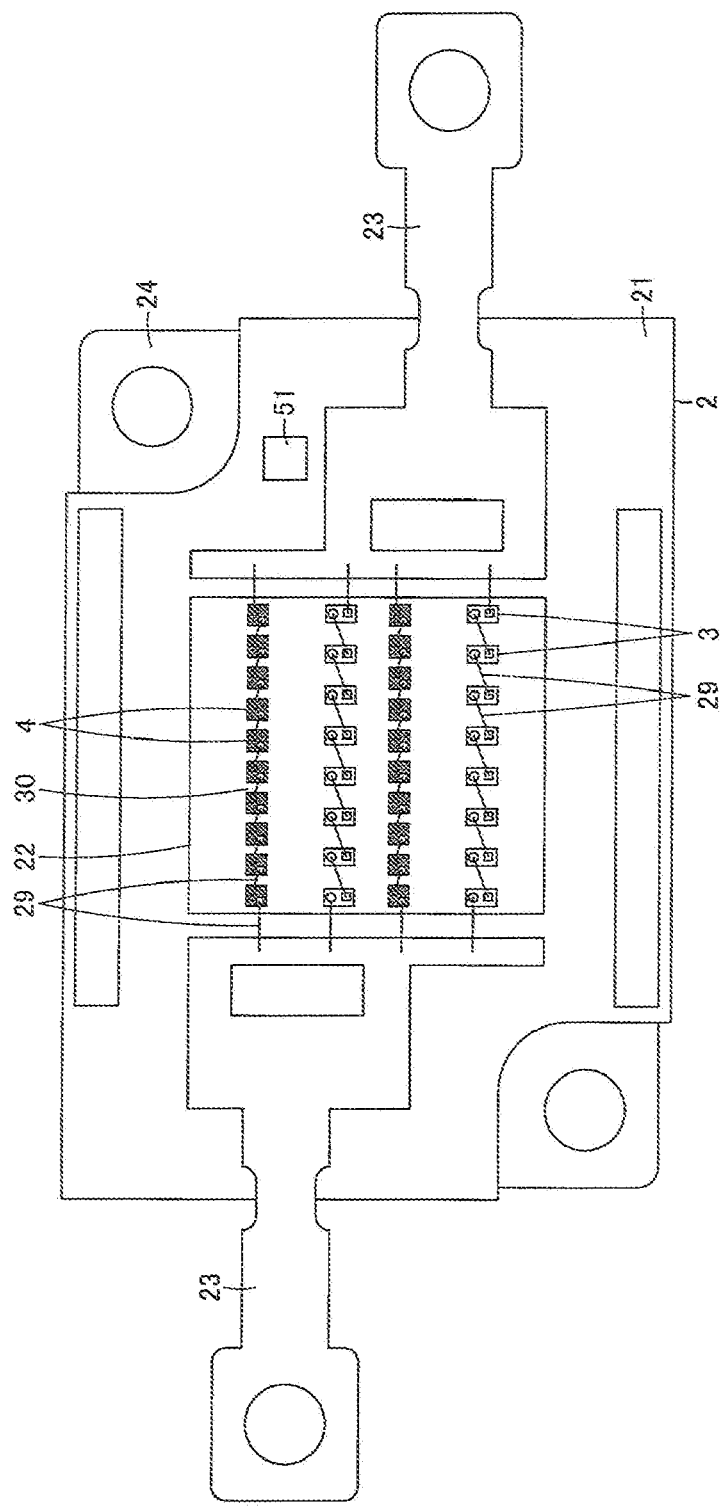
FIG. 24 shows the light emitting device of the eleventh embodiment and is a plan view showing a state where blue light emitting LED elements and red light emitting LED elements are mounted before a frame member and a sealing member are formed.

As shown in FIGS. 23 and 24, a temperature detecting unit 51 constituted by a temperature detecting element such as a thermistor is provided on the substrate 2.

The blue LEDs 3 and the red LEDs 4 are mounted, in a matrix shape, on the mounting pad 22, and element rows of the plurality of blue LEDs 3 and element rows of the plurality of red LEDs 4 are formed. Specifically, the element rows are formed by being arranged laterally (in FIGS. 23 and 24), and the element rows of the blue LEDs 3 and the element rows of the red LEDs 4 are alternately arranged laterally in a direction orthogonal to the element rows, vertical direction (FIGS. 23 and 24). Electrically, two series circuits 30a are formed each in which the blue LEDs 3 of each row are connected in series, two series circuits 30b are formed each in which the red LEDs 4 of each row are connected in series, and the four series circuits 30a and 30b are connected to the power source so as to be in parallel to each other. Accordingly, power is supplied to the series circuits 30a and 30b through the power supply terminals 23.

More specifically, in the element row of the blue LEDs 3 or element row of the red LEDs 4, different electrodes of the adjacent LEDs arranged in an extending direction of the row, an element electrode of an anode side of one of the adjacent LEDs and an element electrode of a cathode side of the other adjacent LED, are connected to each other by the bonding wire 29. The connection is successively performed, the blue LEDs 3 are connected in series in each element row and the red LEDs 4 are connected in series in each element row. In the present embodiment, 8 blue LEDs 3 are provided in each element row of the blue LED 3, and the two element rows are provided. On the other hand, 10 red LEDs 4 are provided in each element row of the red LED 4 and the two element rows are provided.

Figure 25:
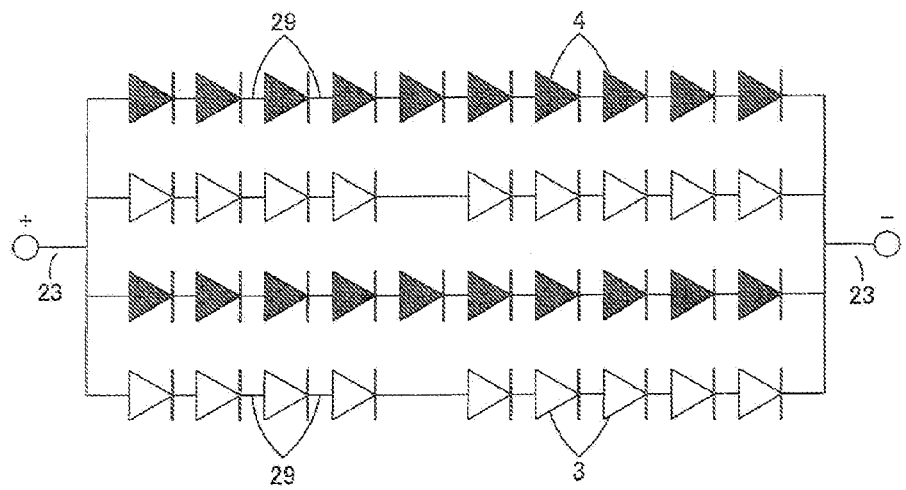
FIG. 25 is a connection diagram indicating a connection state of the blue light emitting LED elements and the red light emitting LED elements.

Next, a connection state of the blue LEDs 3 and the red LEDs 4 will be described mainly with reference to FIG. 25. The blue LED 3 and the red LED 4 generally have a difference in characteristics. In terms of forward voltage (VF), forward voltage (VF) of the red LED 4 is lower than that of the blue LED 3. For example, when the blue LED 3 has a forward voltage (VF) of 3V and a forward current (IF) of 40 mA, voltage between both ends of the series circuit 30a having the 8 blue LEDs 3 connected in series is 24V. Accordingly, the blue LEDs 3 emit light by applying an AC voltage of 24V thereto. Here, since the forward voltage (VF) of the red LED 4 is lower than that of the blue LED 3, the red LEDs 4 each having, for example, a forward voltage (VF) of 2.4V and a forward current (IF) of 20 mA are used. In this case, by connecting the 10 red LEDs 4 to each other, a voltage, between both ends of the series circuit 30b of the red LEDs 4, of 24V can be obtained and can be made equivalent to that of the series circuit 30a of the blue LEDs 3.

Accordingly, by setting, with use of the characteristics of the blue LED 3 and the red LED 4, the numbers of the blue LEDs 3 and the red LEDs 4 so that the total forward voltage (VF) of the blue LEDs 3 in the series circuit 30a and that of the red LEDs 4 in the series circuit 30b are equivalent to each other, the series circuits 30a and 30b can be driven by the same power source (voltage). Thus, the blue LED 3 and the red LED 4 can emit light without specifically inserting a current limiting resistor or the like in each circuit, and circuit constitution can be simplified.

Figure 26:
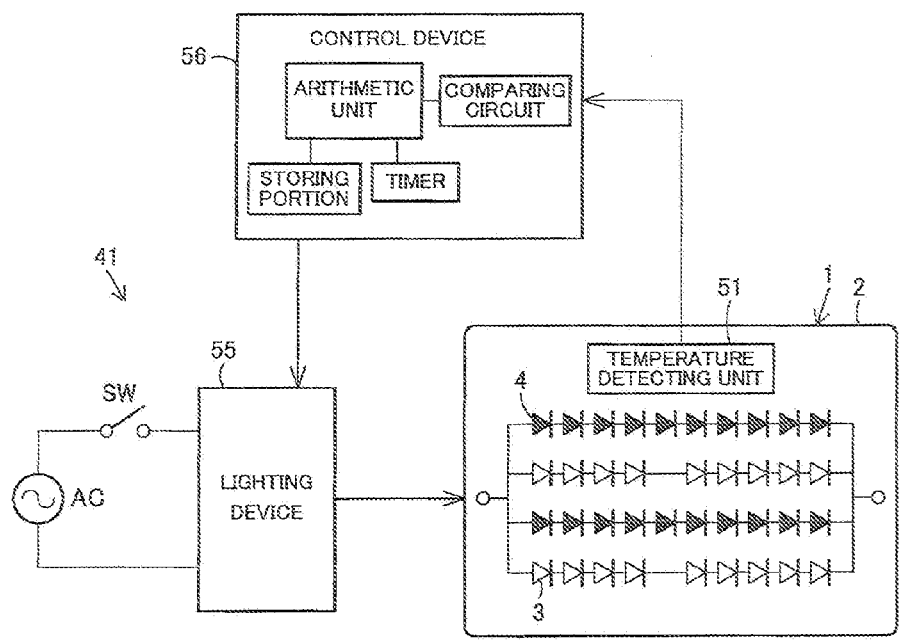
FIG. 26 is a block diagram illustrating the light emitting device of the eleventh embodiment.

Next, the illumination apparatus 41 using the light emitting device 1 will be described with reference to FIG. 26. An apparatus body includes the light emitting device 1, a lighting device 55 and a control device 56. The lighting device 55 is connected to a commercial AC power source, receives alternating current AC from the power source and generates DC output. A full-wave rectifying circuit, a DC voltage converting circuit, etc., are provided in the lighting device 55.

The control device 56 includes an arithmetic unit and a comparing circuit, is connected to the lighting device 55 and the temperature detecting unit 51 and has a function of controlling light emission of the blue LED 3 and red LED 4.

In the illumination apparatus 41, power is supplied to the lighting device 55 through the AC power source and thus a predetermined DC output is supplied to the light emitting device 1 from the lighting device 55. The blue LEDs 3 and the red LEDs 4 of the light emitting device 1 emit light, blue light from the blue LEDs 3, yellow to green light from the yellow fluorescent matter and red light from the red LEDs 4 are mixed, and bulb color light having an excellent color rendering property is emitted. In this case, since the red light is directly radiated from the red LEDs 4, high light emitting efficiency is obtained, red components are mixed and an excellent color rendering property is obtained.

Figure 27:
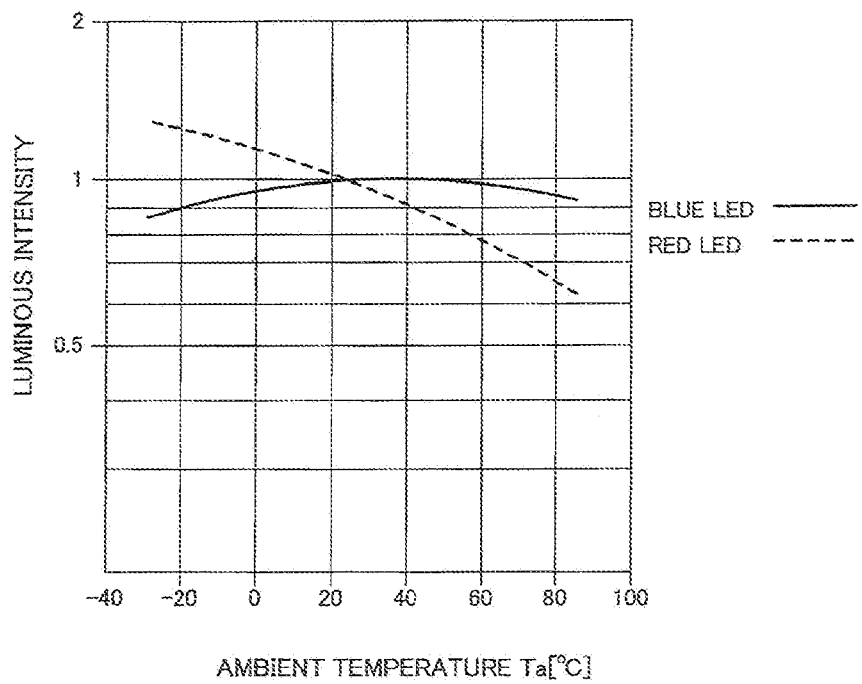
FIG. 27 is a graph indicating relationships between ambient temperature and relative luminous intensity characteristics of the blue light emitting LED elements and the red light emitting LED elements.

On the other hand, characteristics of the blue LED 3 and the red LED 4 are changed by temperature changes, particularly, the characteristics of the red LED 4 are largely changed by the temperature change, and, for example, also the luminous intensity thereof is largely changed by ambient temperature as shown in FIG. 27. Additionally, in association with such characteristics, color of emitted light is largely changed by the temperature change. Accordingly, during use of the illumination apparatus 41, trouble that color of light radiated from the light emitting device 1 is unstable and changed is caused with the passage of time.

In the present embodiment, the temperature detecting unit 51 is provided for suppressing change of color of emitted light. The temperature detecting unit 51 is a temperature detecting element such as a thermistor and disposed on the substrate 2, and indirectly detects the temperature of the blue LEDs 3 and the red LEDs 4 through the temperature of the substrate 2.

When the temperature is detected by the temperature detecting unit 51, the detection result is output to the control device 56. Since, regarding an LED, color of emitted light is changed by change of the forward current (IF), a data table, which indicates change of color of emitted light by change of the forward current (IF), of the red LED 4 is stored in the control device 56. When the control device 56 receives the detection result from the temperature detecting unit 51, it calculates a value of optimal forward current (IF) for correcting the color of emitted light to color of light emitted from the red LED 4 at normal temperature (Ta=25° C.), color of light having a peak wavelength at the normal temperature, and outputs the calculated value to the lighting device 55.

Then, the lighting device 55 outputs forward current (IF) based on the transmitted value to the series circuits 30b of the red LEDs 4. Thus, corrected forward current (IF) flows in the series circuits 30b of the red LEDs 4, that is, color of light emitted from the red LEDs 4 is corrected, and change of color of emitted light by a temperature change can be suppressed.

The series circuit 30a of the blue LEDs 3 and the series circuit 30b of the red LEDs 4 can be separately controlled according to each series circuit 30a and 30b. Therefore, not only the series circuit 30b of the red LEDs 4 but also the series circuit 30a of the blue LEDs 3 can be controlled.

Moreover, forward current (IF) can be controlled by directly connecting the temperature detecting unit 51 to the series circuits 30b of the red LEDs 4. In this case, circuit constitution can be simplified.

Figure 28:
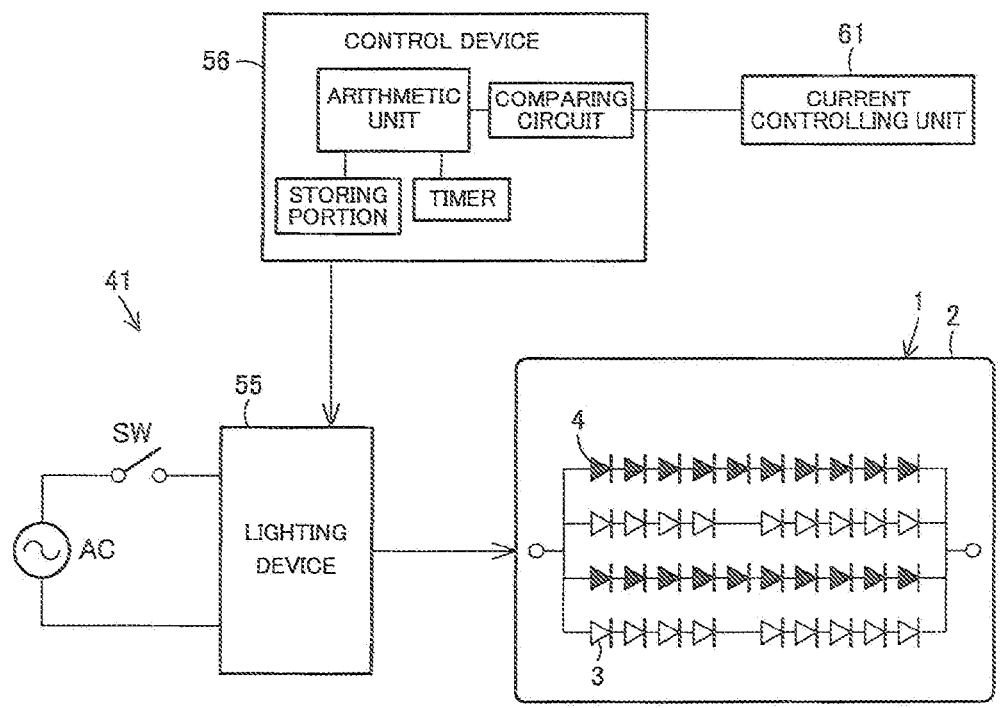
FIG. 28 is a block diagram illustrating a light emitting device of a twelfth embodiment.

Next, a twelfth embodiment will be described with reference to FIG. 28. In addition, the same symbols are attached to the same or corresponding parts as those of the above-described embodiments, and description thereof will be omitted.

In the present embodiment, a current controlling unit 61 is provided. The current controlling unit 61 is connected to the control device 56, and forward current (IF) of the series circuit 30a of the blue LEDs 3 and forward current (IF) of the series circuit 30b of the red LEDs 4 can be separately changed by adjusting the current controlling unit 56.

For example, the series circuit 30a of the blue LEDs 3 having forward current (IF) to be changed or the series circuit 30b of the red LEDs 4 having forward current (IF) to be changed can be selected, a desired color of light can be obtained by changing the forward current after the selection. Accordingly, the series circuit 30a of the blue LEDs 3 and the series circuit 30b of the red LEDs 4 can be separately controlled and thus color of light can be easily controlled.

Moreover, the illumination apparatus 41 can be applied to a light source unit, a lighting fixture used indoors or outdoors, a display device, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A light emitting device which is attached to an illumination apparatus configured to control a light, the light emitting device configured to radiate light having a correlated color temperature of 2400 to 3600K, the device comprising:
    a substrate;
    blue light emitting diode (LED) elements mounted on the substrate;
    red LED elements mounted on the substrate, the red LED elements having reduction rates of luminous intensity according to temperature rise that are higher than reduction rates of luminous intensity of the blue LED elements according to temperature rise;
    a wavelength converting unit configured to be excited by light emitted from the blue LED elements and convert the light emitted from the blue LED elements to light having a peak wavelength within a range of 500 to 600 nm; and
    a lighting circuit configured to control current to both the blue LED elements and the red LED elements to perform dimming control such that a ratio of a current to the blue LED elements to a current to the red LED elements is constant when the light output is controlled at less than full intensity; wherein
    a luminous intensity of the red LED elements is from 0.2 to 2.5 times a luminous intensity of the blue LED elements; and
    when junction temperatures of the blue LED elements and the red LED elements are 120° C. or lower and the light output is dimmed from full intensity to less than full intensity, a color temperature rises, as an intensity of the red LED elements increases relative to the blue LED elements, within a range of 2400K-3600K.

2. The light emitting device according to claim 1, further comprising series circuits in which the blue LED elements and the red LED elements are connected in series.

3. The light emitting device according to claim 1, wherein the plurality of blue LED elements and the plurality of red LED elements are mounted on the substrate and arranged alternately.

4. An illumination apparatus comprising:
    an apparatus body; and
    the light emitting device according to claim 1 disposed on the apparatus body.

5. The light emitting device according to claim 1 comprising:
    a first series circuit in which the plurality of blue LED elements is connected in series;
    a second series circuit in which the plurality of red LED elements is connected in series; and
    a pair of power supply terminals connected to the first series circuit and the second series circuit in parallel.

6. The light emitting device according to claim 5, wherein a sum of a forward voltage of the blue LED elements in the first series circuit and a sum of a forward voltage of the red LED elements in the second series circuit are equal.

7. The light emitting device according to claim 5 comprising a temperature detecting unit disposed on the substrate, wherein the lighting circuit is configured to control current flowing through the first series circuit and the second series circuit based on the temperature detected by the temperature detecting unit.

8. The light emitting device according to claim 1, wherein:
    the blue LED elements are mounted on a central portion of the substrate, and
    the red LED elements are mounted on a portion of the substrate outside the blue LED elements.

9. The light emitting device according to claim 1, wherein the wavelength converting unit comprises:
    a first translucent sealing member comprising a phosphor covering the blue LED elements; and
    a second translucent sealing member covering the read LED elements.

10. The light emitting device according to claim 9, wherein one of the first sealing member and the second sealing member is arranged so as to surround the other one of the first sealing member and the second sealing member.

11. An illumination apparatus comprising:
    an apparatus body;
    a lighting circuit configured to control a light emitting device; and
    the light emitting device disposed on the apparatus body and configured to radiate light having a correlated color temperature of 2400 to 3600K, the light emitting device comprising:

a substrate;

blue LED elements mounted on the substrate;

red LED elements mounted on the substrate, the red LED elements having reduction rates of luminous intensity according to temperature rise that are higher than reduction rates of luminous intensity of the blue LED elements according to temperature rise; and a wavelength converting unit configured to be excited by light emitted from the blue LED elements and convert the light emitted from the blue LED elements to light having a peak wavelength within a range of 500 to 600 nm; wherein the lighting circuit is configured to control current to both the blue LED elements and the red LED elements to perform dimming control such that a ratio of a current to the blue LED elements to a current to the red LED elements is constant when the light output is controlled at less than full intensity, when junction temperatures of the blue LED elements and the red LED elements are 120° C. or lower and the light output is dimmed from full intensity to less than full intensity, a color temperature rises, as an intensity of the red LED elements increases relative to the blue LED elements, within the range of 2400K-3600K; and a luminous intensity of the red LED elements is from 0.2 to 2.5 times a luminous intensity of the blue LED elements.

* * * * *